(12) United States Patent
Ryu et al.

(10) Patent No.: US 12,471,285 B2
(45) Date of Patent: Nov. 11, 2025

(54) SEMICONDUCTOR DEVICE HAVING SELECTION LINE STUD CONNECTED TO STRING SELECTION LINE

(71) Applicant: SAMSUNG ELECTRONICS CO., LTD., Suwon-si (KR)

(72) Inventors: Hyojoon Ryu, Hwaseong-si (KR); Kwanyong Kim, Uijeongbu-si (KR); Seogoo Kang, Seoul (KR); Sunil Shim, Seoul (KR); Wonseok Cho, Suwon-si (KR); Jeehon Han, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 18/138,189

(22) Filed: Apr. 24, 2023

(65) Prior Publication Data

US 2023/0262984 A1 Aug. 17, 2023

Related U.S. Application Data

(63) Continuation of application No. 17/032,277, filed on Sep. 25, 2020, now Pat. No. 11,637,117.

(30) Foreign Application Priority Data

Mar. 16, 2020 (KR) .................. 10-2020-0031894

(51) Int. Cl.
*H10B 43/35* (2023.01)
*H01L 23/522* (2006.01)
(Continued)

(52) U.S. Cl.
CPC ......... *H10B 43/35* (2023.02); *H01L 23/5226* (2013.01); *H10B 43/10* (2023.02); *H10B 43/27* (2023.02); *H10B 43/40* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 7,989,880 B2   8/2011   Wada et al.
9,337,207 B2   5/2016   Park et al.
(Continued)

FOREIGN PATENT DOCUMENTS

KR   10-2019-0012061 A   2/2019
KR   10-2019-0123537 A   11/2019

OTHER PUBLICATIONS

Office Action in Korean Appln. No. 10-2019-0168800, mailed on Sep. 25, 2024, 21 pages (with English translation).

*Primary Examiner* — William B Partridge
*Assistant Examiner* — Gustavo G Ramallo
(74) *Attorney, Agent, or Firm* — Fish & Richardson P.C.

(57) ABSTRACT

A semiconductor device includes; a memory stack disposed on a substrate and including a lower gate electrode, an upper gate stack including a string selection line, a vertically extending memory gate contact disposed on the lower gate electrode, and a vertically extending selection line stud disposed on the string selection line. The string selection line includes a material different from that of the lower gate electrode, and the selection line stud includes a material different from that of the memory gate contact.

20 Claims, 42 Drawing Sheets

(51) Int. Cl.
*H10B 43/10* (2023.01)
*H10B 43/27* (2023.01)
*H10B 43/40* (2023.01)

(58) Field of Classification Search
CPC ........ H10B 53/50; H10B 41/00; H10B 41/10;
H10B 41/20; H10B 41/23; H10B 41/27;
H10B 41/30; H10B 41/35; H10B
41/40–44; H10B 41/46–50; H10B 41/60;
H10B 41/70; H10B 43/00; H10B 43/10;
H10B 43/20; H10B 43/23; H10B 43/27;
H10B 43/30; H10B 43/35; H10B 43/40;
H10B 43/50; H10B 51/00; H10B 51/10;
H10B 51/20; H10B 51/30; H10B 51/40;
H10B 51/50; H01L 27/1027; H01L 27/1028

See application file for complete search history.

(56) References Cited

U.S. PATENT DOCUMENTS

| | | | |
|---|---|---|---|
| 9,601,370 | B2 | 3/2017 | Kato et al. |
| 9,922,987 | B1 | 3/2018 | Mizutani et al. |
| 10,224,104 | B2 | 3/2019 | Chowdhury et al. |
| 10,283,566 | B2 | 5/2019 | Sel et al. |
| 10,355,009 | B1 | 7/2019 | Kai et al. |
| 10,971,516 | B2 | 4/2021 | Ahn et al. |
| 2010/0133606 | A1 | 6/2010 | Jang et al. |
| 2011/0151667 | A1* | 6/2011 | Hwang ................ H10B 41/20 257/E21.585 |
| 2012/0061744 | A1* | 3/2012 | Hwang ................ H10B 43/20 257/E27.081 |
| 2012/0182808 | A1 | 7/2012 | Lue et al. |
| 2014/0264525 | A1* | 9/2014 | Takahashi ........... H10D 30/693 257/314 |
| 2017/0200676 | A1 | 7/2017 | Jeong et al. |
| 2017/0207238 | A1 | 7/2017 | Lee et al. |
| 2017/0287928 | A1 | 10/2017 | Kanamori et al. |
| 2018/0166461 | A1* | 6/2018 | Shim .................... H01L 23/5226 |
| 2019/0035733 | A1 | 1/2019 | Park |
| 2019/0267461 | A1 | 8/2019 | Yada et al. |
| 2019/0326319 | A1 | 10/2019 | Yun et al. |
| 2020/0043830 | A1 | 2/2020 | Baek |
| 2020/0058673 | A1 | 2/2020 | Nishikawa et al. |
| 2020/0119038 | A1* | 4/2020 | Hopkins ................ H10B 43/27 |
| 2020/0235120 | A1* | 7/2020 | Kai ........................ H10B 43/40 |
| 2021/0210426 | A1* | 7/2021 | Lee ................... H01L 21/76802 |
| 2022/0208781 | A1* | 6/2022 | Hong ................ G11C 16/0483 |
| 2022/0336421 | A1* | 10/2022 | Kim ........................ H01L 25/18 |

* cited by examiner

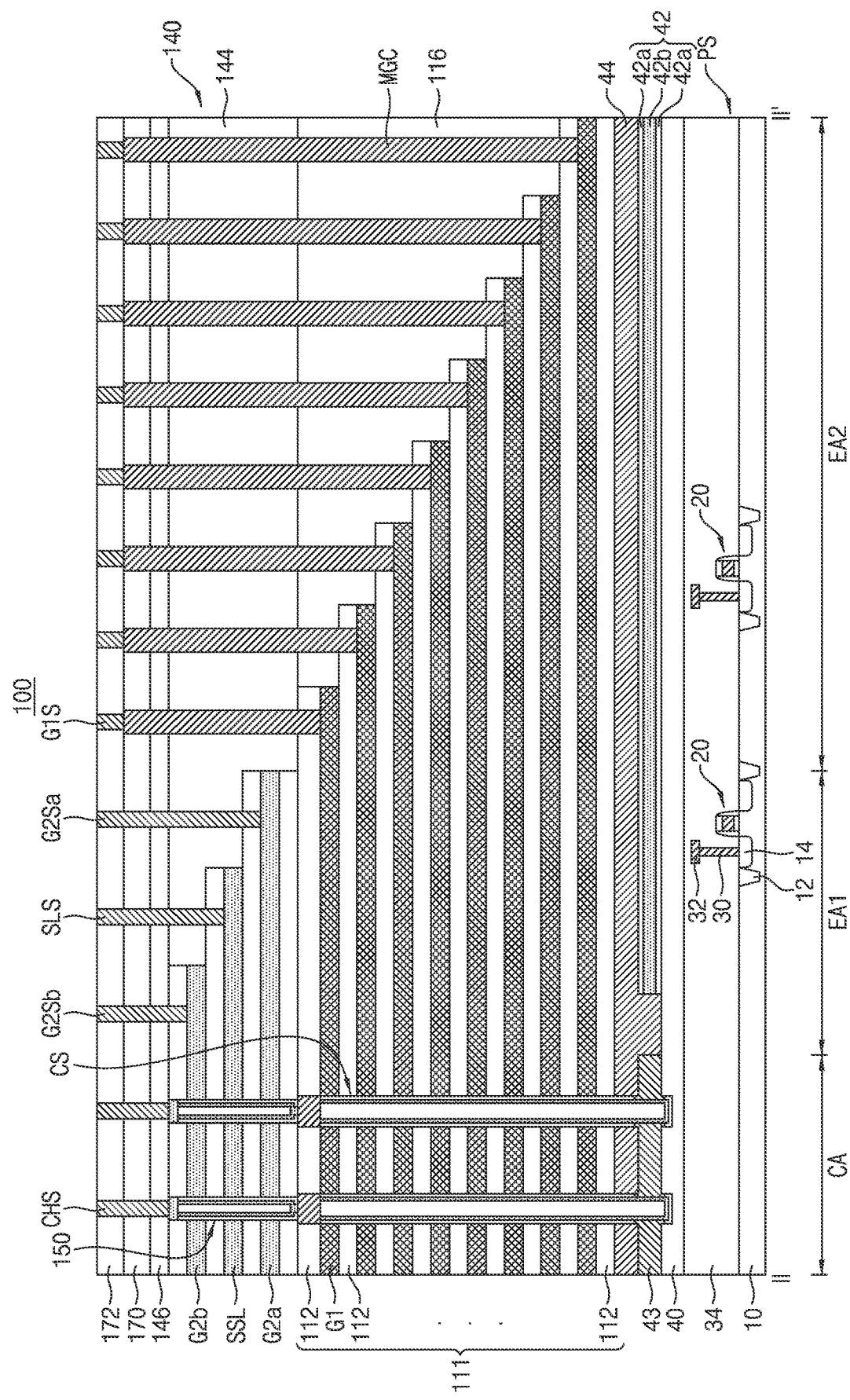

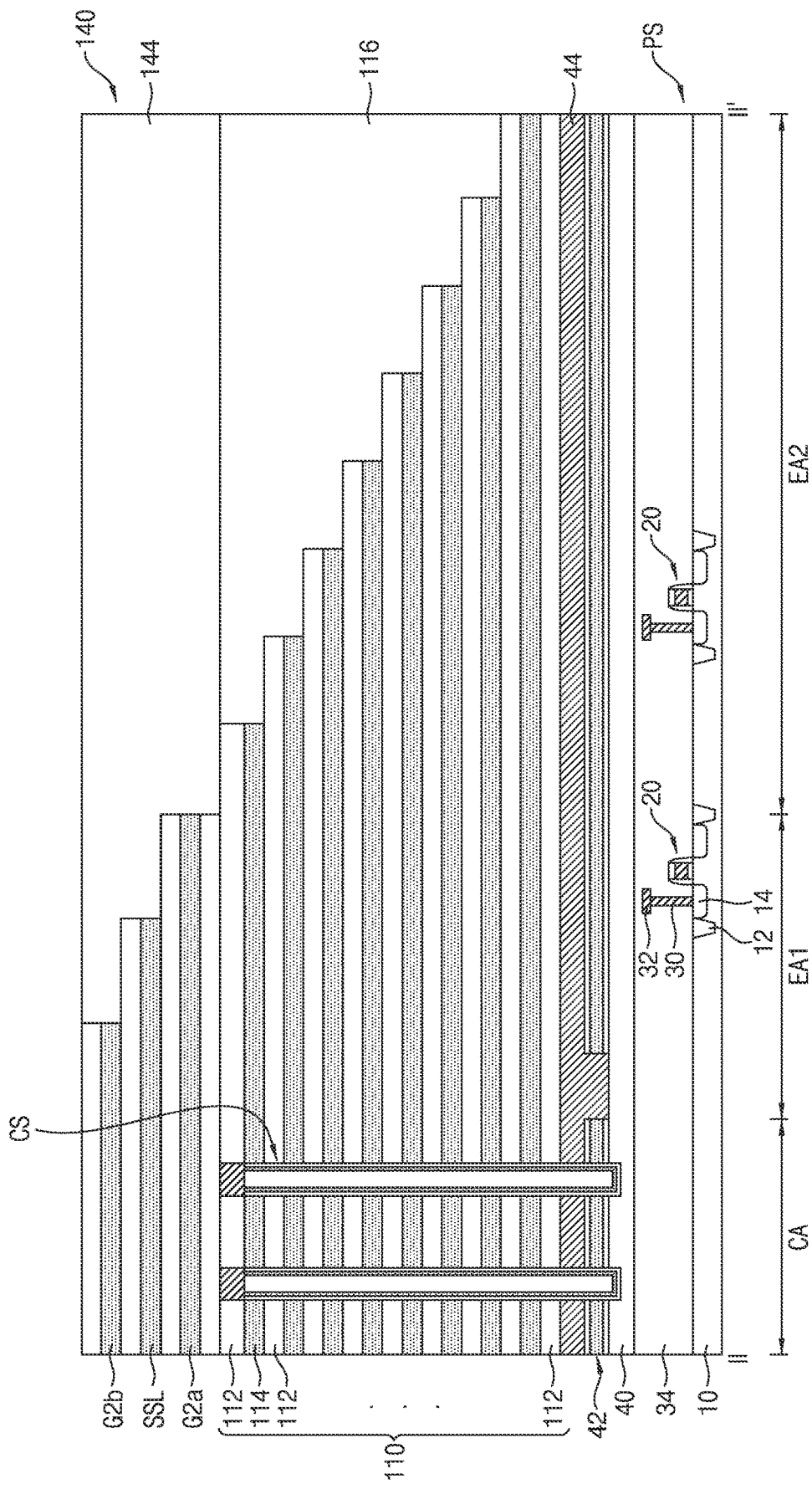

SEMICONDUCTOR DEVICE HAVING SELECTION LINE STUD CONNECTED TO STRING SELECTION LINE

CROSS-REFERENCE TO THE RELATED APPLICATION

This is a Continuation of U.S. patent application Ser. No. 17/032,277, filed Sep. 25, 2020, and a claim of priority is made to Korean Patent Application No. 10-2020-0031894 filed on Mar. 16, 2020 in the Korean Intellectual Property Office, the subject matter of which is hereby incorporated by reference.

BACKGROUND

1. Field

The inventive concept relates generally to semiconductor devices including a selection line stud connected to a string selection line.

2. Description of the Related Art

Three-dimensional nonvolatile memory devices having a multi-stack structure have been proposed to meet the demands presented by battery-powered, lightweight, physically thin and small and highly integrated electronic products. Nonvolatile memory devices include among other components, gate electrodes, a string selection line, a memory gate contact connected to the gate electrodes, and a selection line stud connected to the string selection line. However, potential issues may arise when the string selection line is penetrated (or punched through) during the formation of the memory gate contact and/or the selection line stud.

SUMMARY

Embodiments of the inventive concept provide semiconductor devices including a selection line stud including a same material as a string selection line.

In one embodiment the inventive concept provides a semiconductor device including; a memory stack disposed on a substrate, the memory stack including a lower gate electrode, a channel structure vertically penetrating the memory stack, an upper gate stack disposed on the memory stack, the upper gate stack including a string selection line, a channel contact vertically penetrating the upper gate stack and connected to the channel structure, a vertically extending memory gate contact disposed on the lower gate electrode and a vertically extending selection line stud disposed on the string selection line, wherein the string selection line includes a material different from a material of the lower gate electrode, and the selection line stud includes a material different from a material of the memory gate contact.

In one embodiment the inventive concept provides a semiconductor device including; a substrate including a cell array region, a first extension region, and a second extension region, the first extension region being disposed between the cell array region and the second extension region, a memory stack disposed on the substrate, the memory stack including a lower gate electrode, a channel structure disposed in the cell array region and vertically penetrating the memory stack, an upper gate stack disposed on the memory stack, the upper gate stack including string selection lines, string selection line isolation layers disposed between the string selection lines and extending in a first horizontal direction, a channel contact vertically penetrating the upper gate stack and connected to the channel structure, a vertically extending memory gate contact disposed on the lower gate electrode in the second extension region, and a vertically extending selection line stud disposed on the string selection line in the first extension region, wherein the string selection line includes a material different from a material of the lower gate electrode, and the selection line stud includes a material different from a material of the memory gate contact.

In one embodiment the inventive concept provides a semiconductor device including; a memory stack disposed on a substrate, the memory stack including a lower gate electrode, channel structures vertically penetrating the memory stack, an upper gate stack disposed on the memory stack, the upper gate stack including a first upper gate electrode, a string selection line disposed on the first upper gate electrode, and a second upper gate electrode disposed on the string selection line, channel contacts vertically penetrating the upper gate stack and connected to the channel structures, a string selection line isolation layer disposed between the channel contacts, an isolation insulating layer vertically penetrating the memory stack and the upper gate stack, a vertically extending memory gate contact disposed on the lower gate electrode, vertically extending channel studs disposed on the channel contacts, a vertically extending, first upper stud disposed on the first upper gate electrode, a vertically extending, second upper stud disposed on the second upper gate electrode and a vertically extending selection line stud disposed on the string selection line, wherein the string selection line and the selection line stud include polysilicon, the lower gate electrode and the memory gate contact comprise tungsten, and a top surface of the selection line stud is disposed at a higher level than a top surface of the memory gate contact.

BRIEF DESCRIPTION OF THE DRAWINGS

The above and other objects, features, and advantages of the inventive concept will become more apparent to those skilled in the art upon consideration of the following detailed description taken together with the accompanying drawings.

FIGS. 2A and 2B are cross-sectional views of the semiconductor device of FIG. 1 taken respectively along lines I-I' and II-II'.

FIGS. 4, 5A, 5B, 6, 7A, 7B, 8, 9A, 9B, 10, 11A, 11B, 12, 13, 14, 15A, 15B, 16, 17A, 17B, 18, 19A, 19B, 20, 21A and 21B are plan views and related cross-sectional views illustrating, in certain embodiments, various methods of manufacturing for semiconductor devices according to embodiments of the inventive concept.

DETAILED DESCRIPTION

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
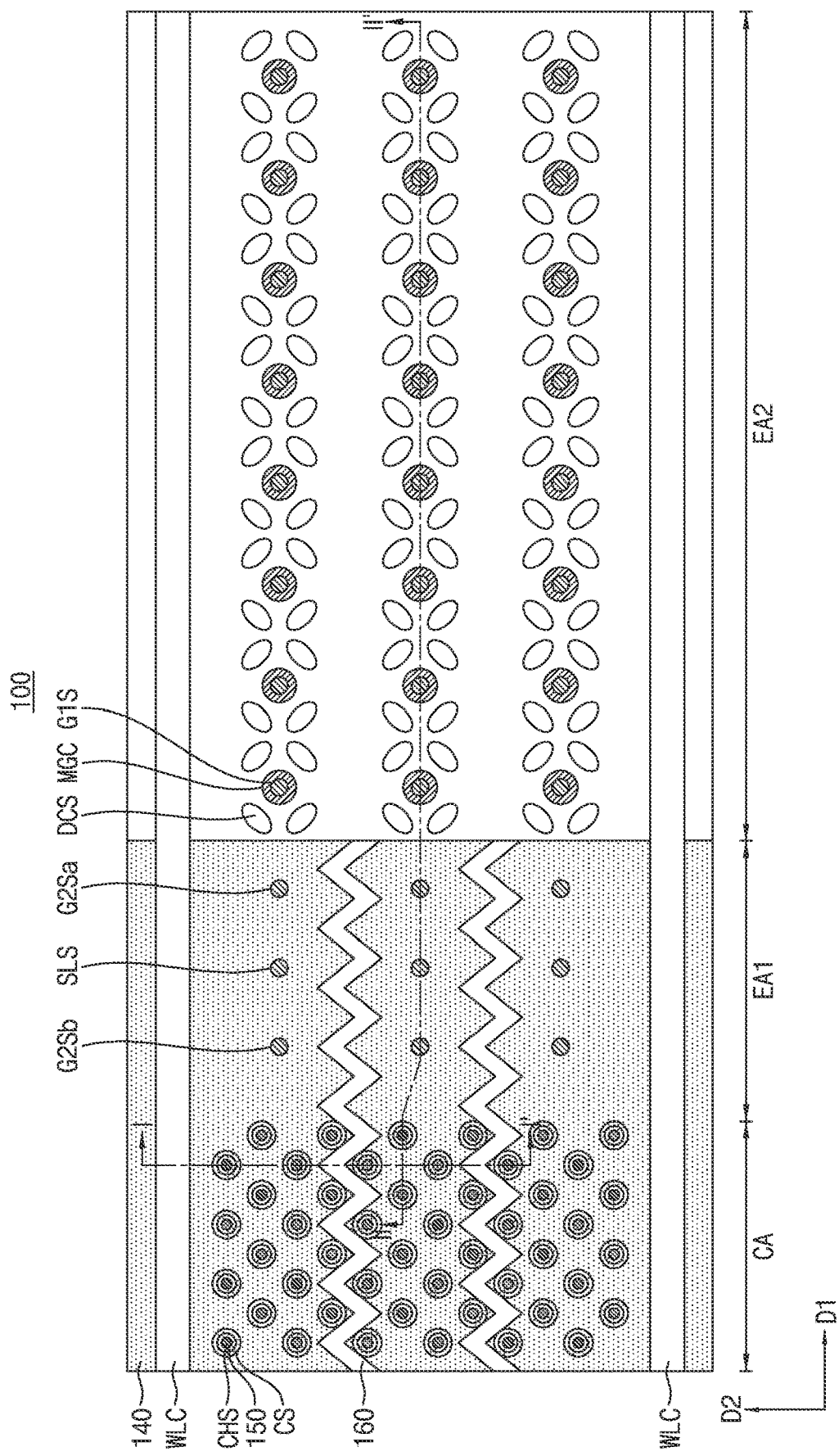
FIG. 1 is a layout (or plan view) of a semiconductor device according to an embodiment of the inventive concept.
Figure 2A:
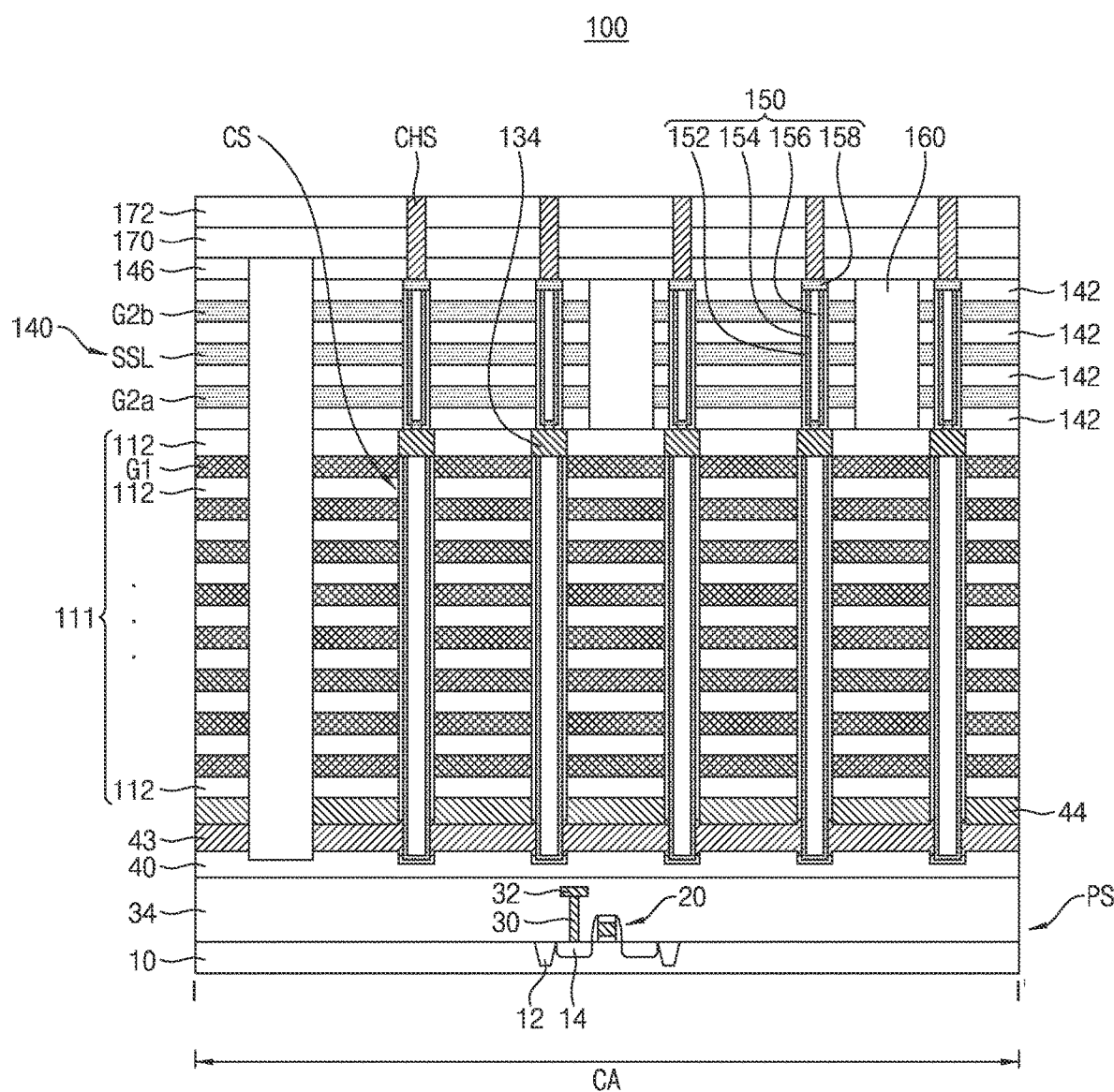

Figure (FIG. 1 is a layout of a semiconductor device according to embodiments of the inventive concept; and FIGS. 2A and 2B are cross-sectional views of the semiconductor device shown in FIG. 1 respectively taken along lines I-I' and II-II'. In the description that follows, a three-dimensional (3D), NAND flash memory is assumed as an illustrative example. However, those skilled in the art will recognize that the inventive concept may be applied to other types of semiconductor devices.

Referring to FIGS. 1, 2A and 2B, a semiconductor device 100 may include a cell array region CA, a first extension region EA1, and a second extension region EA2.

The cell array region CA may include channel structures CS. The first extension region EA1 may be disposed between the cell array region CA and the second extension region EA2, and may include a selection line stud SLS, a first upper stud G2Sa, and a second upper stud G2Sb. The second extension region EA2 may include dummy channel structures DCS, memory gate contacts MGC, and lower studs G1S. An isolation insulating layer WLC may extend in a first horizontal direction D1 over the cell array region CA, the first extension region EA1, and the second extension region EA2.

The semiconductor device 100 may also include a peripheral circuit structure PS, a memory stack 111, a channel structure CS, an upper gate stack 140, a channel contact 150, a string selection line isolation layer 160, a channel stud CHS, a selection line stud SLS, a first upper stud G2Sa, a second upper stud G2Sb, and a lower stud G1S. In this regard, the semiconductor device 100 has a cell-over-periphery (COP) structure, but those skilled in the art will recognize that inventive concept may be applied to semiconductor devices having different structures.

However, in the illustrated example of FIG. 1, the peripheral circuit structure PS is disposed below a memory stack 111, is formed on a substrate 10, and includes a device isolation layer 12, an impurity region 14, a transistor 20, a contact plug 30, a peripheral circuit wire 32 and a peripheral insulating layer 34. Here, the device isolation layer 12 and the impurity region 14 may be disposed on a top surface of the substrate 10. The transistor 20, the contact plug 30, and the peripheral circuit wire 32 may be disposed on the substrate 10.

The substrate 10 may include one or more semiconductor material(s), such as silicon, germanium, silicon-germanium, silicon-on-insulator (SOI), etc. That is, the substrate 10 may include a group IV semiconductor, a group III-V compound semiconductor, or a group II-VI oxide semiconductor.

The impurity region 14 may be disposed adjacent to the transistor 20. The peripheral insulating layer 34 may cover the transistor 20 and the contact plug 30. The contact plug 30 may be electrically connected to the impurity region 14. The peripheral circuit wire 32 may be connected to the contact plug 30.

A lower conductive layer 40, a connection mold layer 42, a connection conductive layer 43, and a supporter 44 may be disposed on the peripheral circuit structure PS. The lower conductive layer 40 may be disposed on the peripheral insulating layer 34, and may correspond to a common source line CSL. Here, the lower conductive layer 40 may include doped polysilicon. The connection mold layer 42 may partially cover the lower conductive layer 40. The connection mold layer 42 may include a protective layer 42a disposed on the top and bottom surfaces of the insulating layer 42b. The connection conductive layer 43 may be disposed on the lower conductive layer 40 in the cell array region CA. The supporter 44 may be disposed on the connection mold layer 42 and the connection conductive layer 43, and may contact with the top surface of the lower conductive layer 40.

The memory stack 111 may be disposed on the supporter 44. The memory stack 111 may include lower mold layers 112 and lower gate electrodes G1, which are alternately stacked. At least one of the lower gate electrodes G1 disposed at the lower side of the memory stack 111 may be a ground selection line GSL. The lower gate electrodes G1 may include a word line. The memory stack 111 may have a stair-stepped structure in the second extension region EA2. The lower mold layers 112 may include silicon oxide. The lower gate electrodes G1 may include tungsten. A lower interlayer insulating layer 116 may cover the stair-stepped structure of the memory stack 111.

The channel structures CS may vertically extend (i.e., extend in a vertical direction relative to the first horizontal direction D1 and a second horizontal direction D2) through the connection conductive layer 43, the supporter 44, and the memory stack 111 in the cell array region CA. The channel structures CS may be electrically connected to the connection conductive layer 43.

Conductive pads 134 may be disposed on the channel structures CS. The dummy channel structure DCS may be disposed in the second extension region EA2. The dummy channel structure DCS may include a configuration that is the same as, or similar to that of the channel structure CS.

The upper gate stack 140 may be disposed on the memory stack 111. The upper gate stack 140 may include at least one gate electrode and at least one upper mold layer 142. The memory stack 111 may include a first upper gate electrode G2a, a string selection line SSL, and a second upper gate electrode G2b. The first upper gate electrode G2a, the string selection line SSL, and the second upper gate electrode G2b may be disposed between the upper mold layers 142. The string selection line SSL may be disposed on the first upper gate electrode G2a, and the second upper gate electrode G2b may be disposed on the string selection line SSL. The upper gate stack 140 may have a stair-stepped structure in the first extension region EA1. An upper interlayer insulating layer 144 may cover the stair-stepped structure of the upper gate stack 140. A first upper insulating layer 146 may cover the top surface of the upper gate stack 140.

The first upper gate electrode G2a may be used as a dummy line that maintains the threshold voltage of the string selection line SSL constant. The string selection line SSL may be used to select a cell string. The second upper gate electrode G2b may be used to select a cell string and to erase the memory. The first upper gate electrode G2a, the string selection line SSL, and the second upper gate electrode G2b may include a material different from that of the lower gate electrode G1. The first upper gate electrode G2a, the string selection line SSL, and the second upper gate electrode G2b may include polysilicon.

The channel contacts 150 may vertically penetrate the upper gate stack 140. Each of the channel contacts 150 may be disposed in vertical alignment with (or vertically aligned with) a corresponding channel structure CS, and may contact with the conductive pad 134. The channel contact 150 may include a string insulating layer 152, a string channel layer 154, a string buried layer 156, and a string conductive pad 158. The string insulating layer 152 may be disposed between the first upper gate electrode G2a and the string channel layer 154, between the string selection line SSL and the string channel layer 154, and between the second upper gate electrode G2b and the string channel layer 154, and may vertically extend. The string channel layer 154 may be disposed inside the string insulating layer 152, and may contact with the conductive pad 134. The string buried layer 156 may fill the interior of the string channel layer 154. The string conductive pad 158 may be disposed at the upper side of the channel contact 150. The string conductive pad 158 may be electrically connected to the conductive pad 134 via the string channel layer 154.

The string selection line isolation layer 160 may vertically penetrate the upper gate stack 140. The string selection line SSL may vertically penetrate the first upper gate electrode G2a, the string selection line SSL, and the second upper gate electrode G2b. Viewed in plan (i.e., from the top down), the string selection line isolation layer 160 may have a zigzag pattern, and may extend in the first horizontal direction D1. A pair of isolation insulating layers WLC may be spaced apart from each other in a second horizontal direction D2, and two string selection line isolation layers 160 may be disposed between the isolation insulating layers WLC. The string selection lines SSL may be electrically insulated by the string selection line isolation layers 160.

The isolation insulating layer WLC may vertically penetrate the first upper insulating layer 146, the upper gate stack 140, the memory stack 111, the supporter 44, and the connection conductive layer 43. The isolation insulating layer WLC may extend in the first horizontal direction D1, and may be formed in the cell array region CA, the first extension region EA1, and the second extension region EA2.

A second upper insulating layer 170 may be disposed on the first upper insulating layer 146.

The memory gate contacts MGC may be disposed in the second extension region EA2. The memory gate contacts MGC may vertically penetrate the upper gate stack 140, the first upper insulating layer 146, and the second upper insulating layer 170, and may partially penetrate the memory stack 111 (and may therefore be said to "vertically extend"). Each memory gate contact MGC may be connected to a corresponding lower gate electrode G1. The memory gate contacts MGC may include the same material as the lower gate electrodes G1.

A third upper insulating layer 172 may be disposed on the second upper insulating layer 170.

The channel studs CHS may be disposed in the cell array region CA, and may vertically penetrate the second upper insulating layer 170 and the third upper insulating layer 172. The channel studs CHS may be connected to the channel contacts 150. The channel studs CHS may be electrically connected to the channel structures CS via the channel contacts 150.

The lower studs G1S may be disposed in the second extension region EA2, and may vertically penetrate the third upper insulating layer 172. The lower studs G1S may be connected to the memory gate contacts MGC. The lower studs G1S may be electrically connected to the lower gate electrodes G1 via the memory gate contacts MGC.

The selection line stud SLS, the first upper stud G2Sa, and the second upper stud G2Sb may be disposed in the first extension region EA1, and may vertically penetrate the first upper insulating layer 146, the second upper insulating layer 170, and the third upper insulating layer 172 (and may therefore be said to "vertically extend"). The selection line stud SLS, the first upper stud G2Sa, and the second upper stud G2Sb may be connected to the string selection line SSL, the first upper gate electrode G2a, and the second upper gate electrode G2b, respectively.

The top surfaces of the channel studs CHS, the lower studs G1S, the selection line stud SLS, the first upper stud G2Sa, and the second upper stud G2Sb may be disposed (or located) at a same level. The top surfaces of the lower studs G1S may be disposed at a relatively higher level than the top surfaces of the memory gate contacts MGC. The bottom surfaces of the lower studs G1S may be disposed at a relatively higher level than the bottom surfaces of the channel studs CHS.

The selection line stud SLS, the first upper stud G2Sa, and the second upper stud G2Sb may include the same material as the first upper gate electrode G2a, the string selection line SSL, and the second upper gate electrode G2b. Further, the selection line stud SLS, the first upper stud G2Sa, and the second upper stud G2Sb may include a same material as the channel studs CHS and the lower studs G1S. The channel studs CHS, the lower studs G1S, the selection line stud SLS, the first upper stud G2Sa, and the second upper stud G2Sb may include polysilicon.

Figure 3:
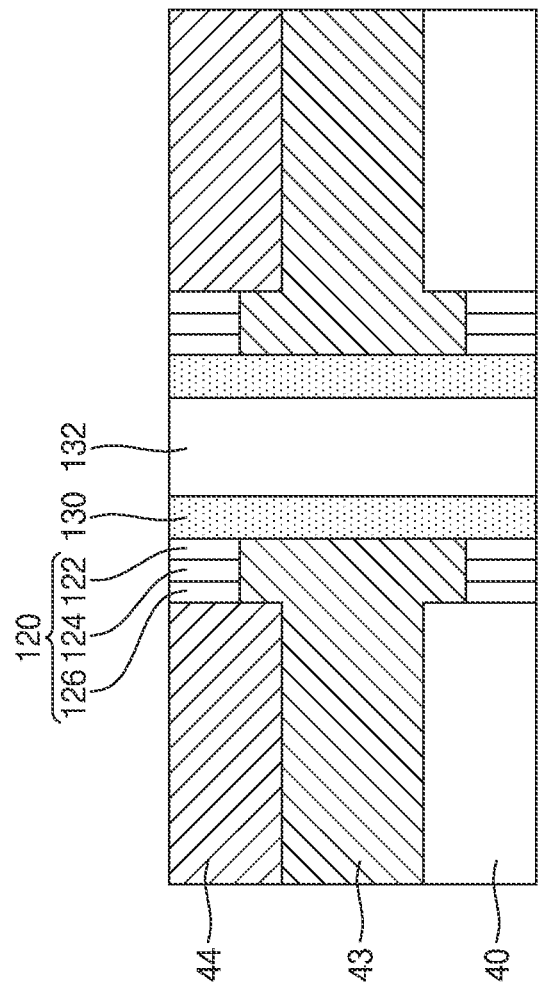
FIG. 3 is an enlarged view of the semiconductor device shown in FIG. 1.
Figure 3:
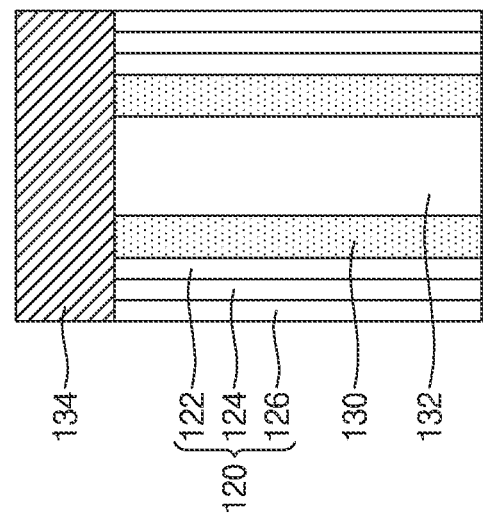

FIG. 3 is an enlarged view of the semiconductor device of FIG. 1.

Referring to FIG. 3, the channel structure CS may include an information storage layer 120, a channel layer 130, and a buried insulating pattern 132. The channel layer 130 may be disposed inside the information storage layer 120, and the buried insulating pattern 132 may be disposed inside the channel layer 130. The information storage layer 120 may include a blocking layer 122, a charge storage layer 124, and a tunnel insulating layer 126. The charge storage layer 124 may be disposed inside the blocking layer 122, and the tunnel insulating layer 126 may be disposed inside the charge storage layer 124. The channel layer 130 may include polysilicon. The buried insulating pattern 132 may include silicon oxide, silicon nitride, silicon oxynitride, or combinations thereof. The blocking layer 122 and the tunnel insulating layer 126 may include silicon oxide, and the charge storage layer 124 may include silicon nitride. The dummy channel structure DCS may have substantially the same structure as the channel structure CS. For example, the dummy channel structure DCS may include an information storage layer 120, a channel layer 130, and a buried insulating pattern 132.

The connection conductive layer 43 may penetrate the information storage layer 120, and may contact with a side surface of the channel layer 130. The portion of the connection conductive layer 43 that is in contact with the channel layer 130 may vertically extend.

FIGS. 4, 5A, 5B, 6, 7A, 7B, 8, 9A, 9B, 10, 11A, 11B, 12, 13, 14, 15A, 16, 17A, 17B, 18, 19A, 19B, 20, 21A and 21B are plan views and related cross-sectional views illustrating, in certain embodiments, various methods of manufacturing for semiconductor devices according to embodiments of the inventive concept, wherein FIGS. 5A, 7A, 9A, 11A, 13, 15A, 17A, 19A and 21A are cross-sectional views taken respectively along line I-I' in FIGS. 4, 6, 8, 10, 12, 14, 16, 18 and 20, and FIGS. 5B, 7B, 9B, 11B, 15B, 17B, 19B and 21B are cross-sectional views taken respectively along line II-II' in FIGS. 4, 6, 8, 10, 14, 16, 18 and 20.

Figure 4:
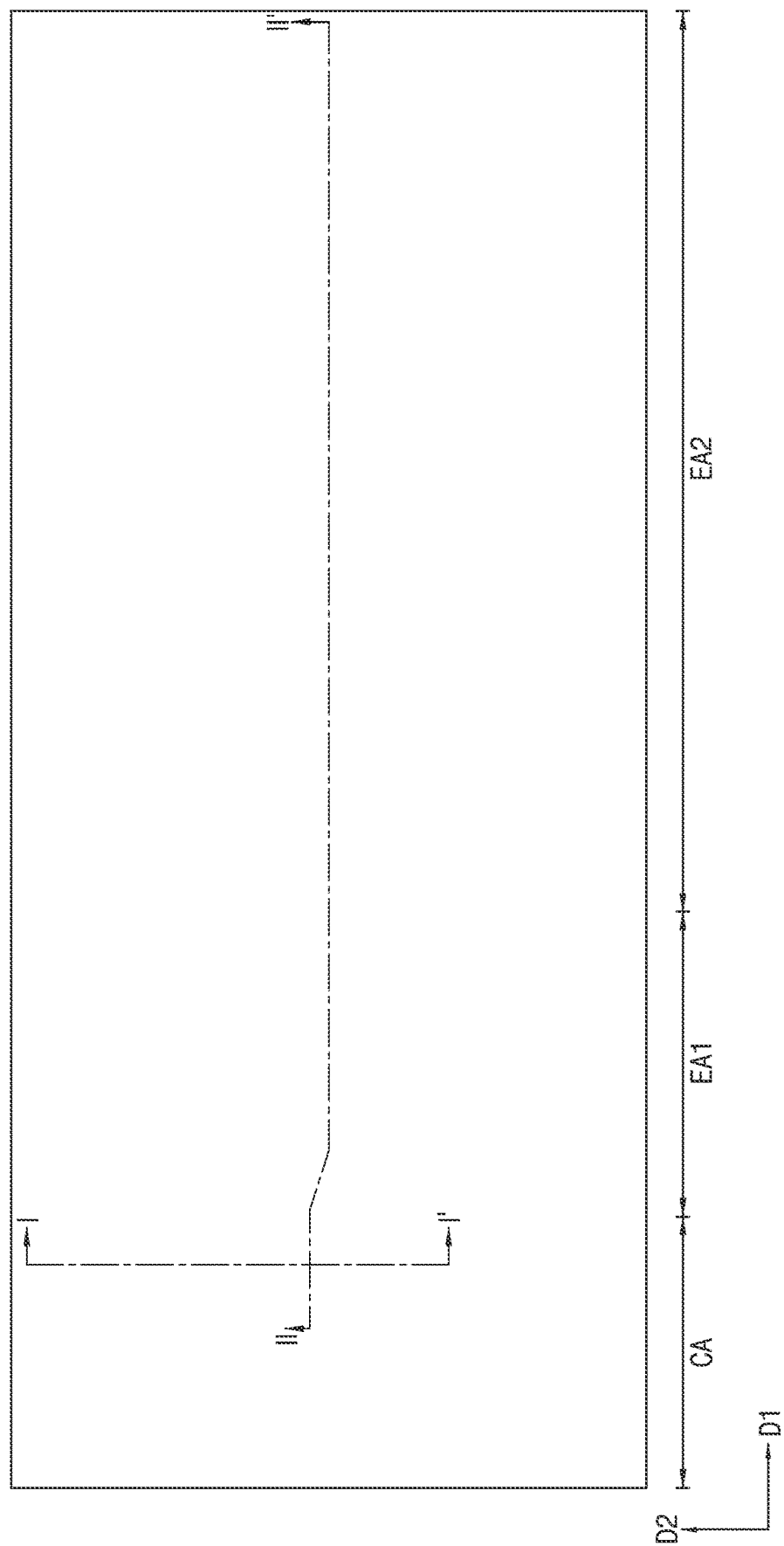
Figure 5A:
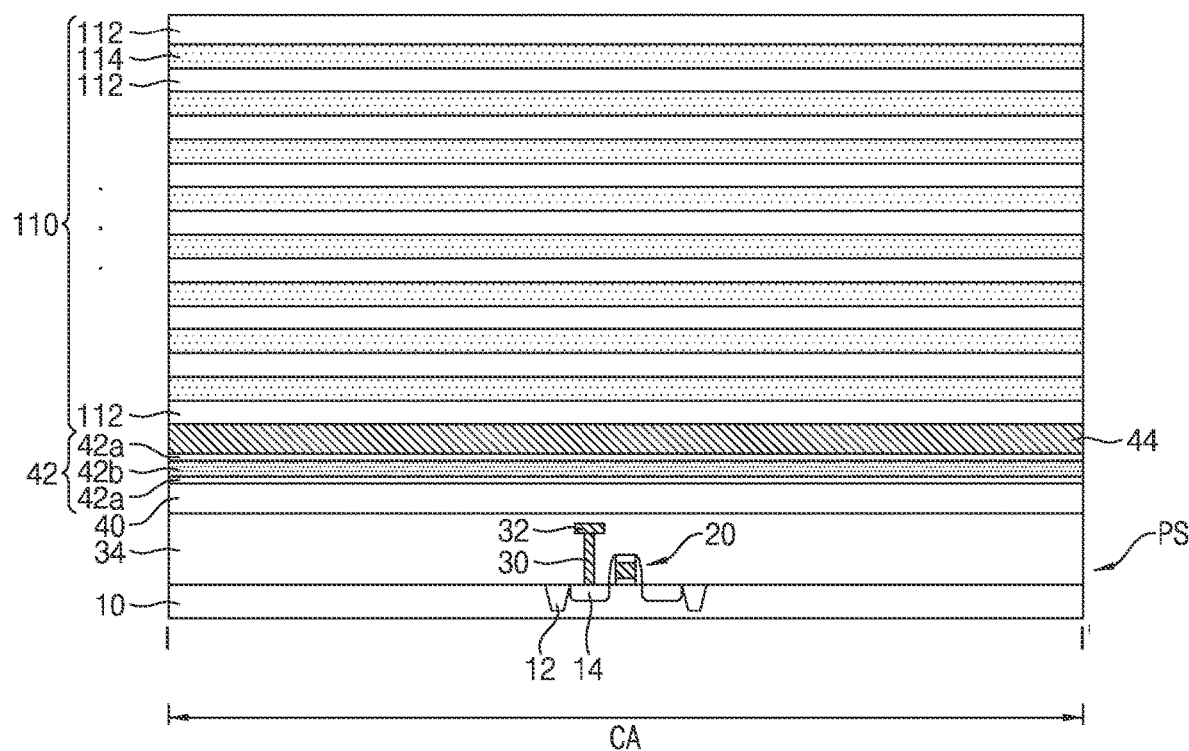
Figure 5B:
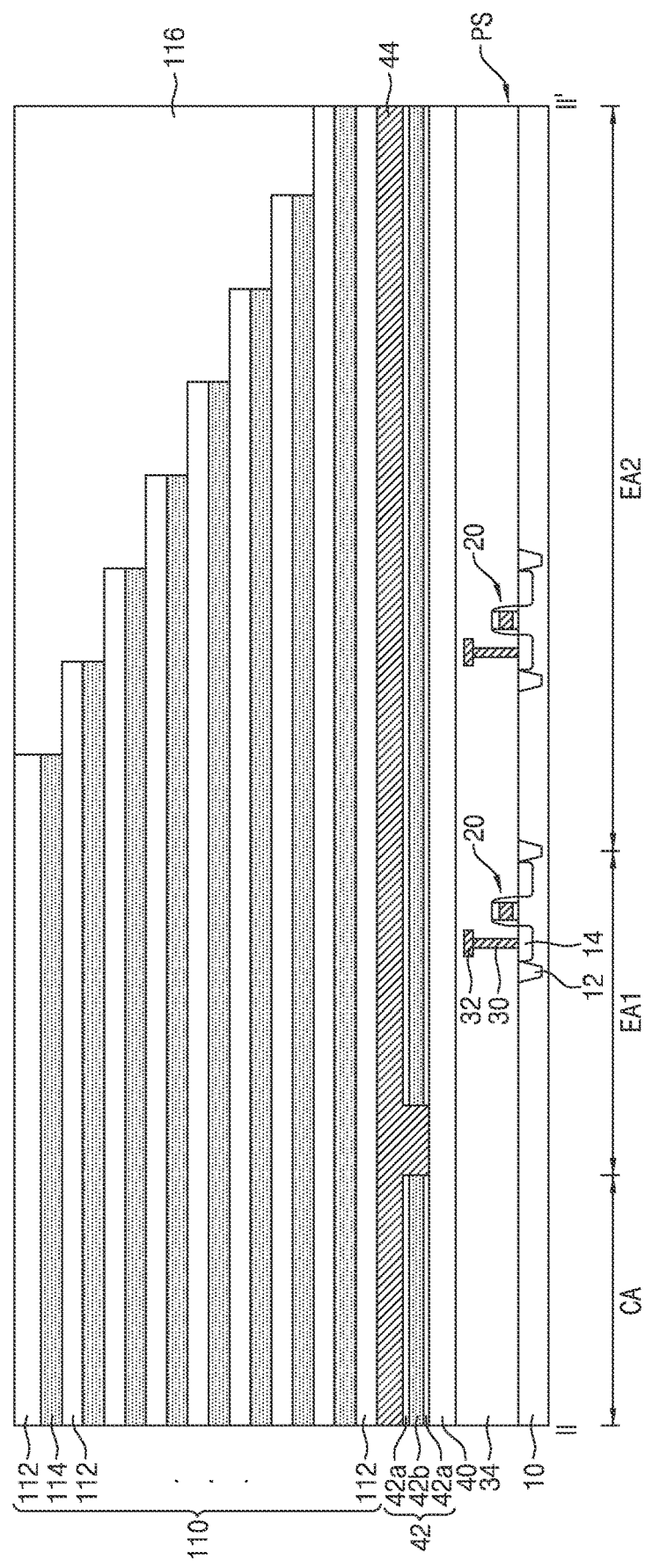
Figure 6:
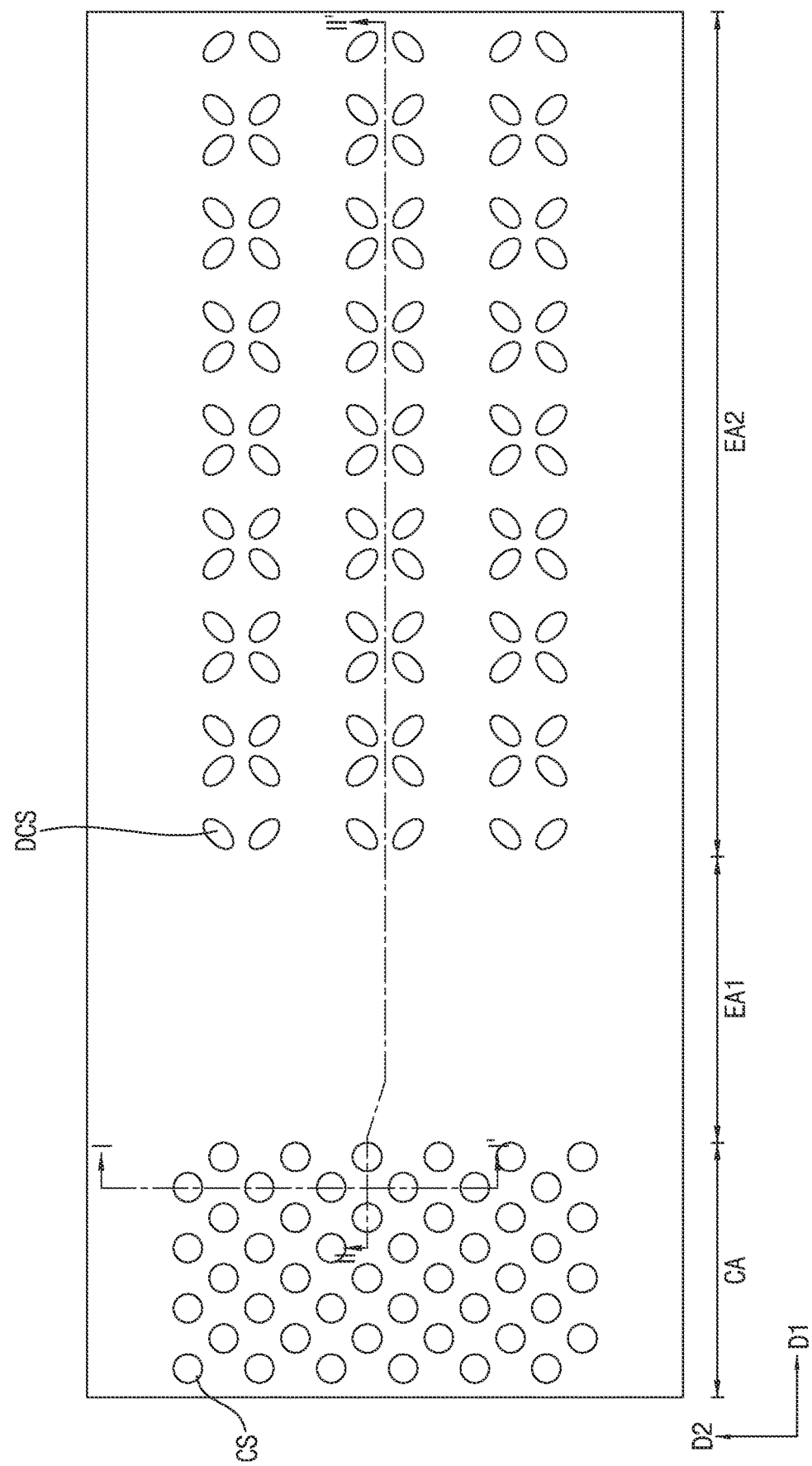

Referring to FIGS. 4, 5A and 5B, a peripheral circuit structure PS, a lower conductive layer 40, a connection mold layer 42, a supporter 44, a mold stack 110, and a lower interlayer insulating layer 116 may be formed. The peripheral circuit structure PS may include a device isolation layer 12, an impurity region 14, a transistor 20, a contact plug 30, a peripheral circuit wire 32, and a peripheral insulating layer 34. The device isolation layer 12 and the impurity region 14 may be formed on the top surface of a substrate 10. The device isolation layer 12 may include an insulating layer such as silicon oxide or silicon nitride. The impurity region 14 may include at least one N-type impurity and/or at least one P-type impurity. The transistor 20 may be disposed adjacent to the impurity region 14. The peripheral circuit wire 32 may be disposed on the contact plug 30, and may be connected to the impurity region 14 via the contact plug 30. The peripheral insulating layer 34 may cover the transistor 20, the contact plug 30, and the peripheral circuit wire 32.

The lower conductive layer 40 may be disposed on the peripheral circuit structure PS. The connection mold layer 42 may be disposed on the lower conductive layer 40, and may partially expose the lower conductive layer 40. The supporter 44 may cover the exposed portion of the lower conductive layer 40 and the connection mold layer 42. The lower conductive layer 40 may include a metal, metal nitride, metal silicide, metal oxide, conductive carbon, polysilicon, or combinations thereof. The lower conductive layer 40 may include a doped polysilicon layer. The connection mold layer 42 may include an insulating layer 42b and a protective layer 42a disposed on the top and bottom surfaces of the insulating layer 42b. The connection mold layer 42 may include a material having etch selectivity with respect to the lower conductive layer 40, and the protective layer 42a may include a material having etch selectivity with respect to the insulating layer 42b. The protective layer 42a may include silicon oxide, and the insulating layer 42b may include silicon nitride. The supporter 44 may include polysilicon.

The mold stack 110 may be disposed on the supporter 44. The mold stack 110 may include lower mold layers 112 and sacrificial layers 114, which are alternately stacked. The lower mold layers 112 may include silicon oxide, and the sacrificial layers 114 may include silicon nitride. The mold stack 110 may be trimmed to form a stair-stepped structure in the second extension region EA2. The lower interlayer insulating layer 116 may cover the mold stack 110 in the second extension region EA2. The lower interlayer insulating layer 116 may include a silicon oxide, silicon nitride, silicon oxynitride, a low-k dielectric material, a high-k dielectric material, or combinations thereof. For example, the lower interlayer insulating layer 116 may include silicon oxide.

Referring to FIGS. 3, 6, 7A and 7B, channel structures CS and dummy channel structures DCS may be formed. The channel structures CS may be disposed in the cell array region CA, and the dummy channel structures DCS may be disposed in the second extension region EA2. The channel structure CS may include an information storage layer 120, a channel layer 130, and a buried insulating pattern 132. The channel layer 130 may be disposed inside the information storage layer 120, and the buried insulating pattern 132 may be disposed inside the channel layer 130. The information storage layer 120 may include a blocking layer 122, a charge storage layer 124, and a tunnel insulating layer 126. The charge storage layer 124 may be disposed inside the blocking layer 122, and the tunnel insulating layer 126 may be disposed inside the charge storage layer 124. The dummy channel structures DCS may have substantially the same structure as the channel structures CS.

The conductive pad 134 may be disposed on the channel structures CS. The conductive pad 134 may include a conductive layer such as a metal, metal nitride, metal oxide, metal silicide, conductive carbon, polysilicon, or combinations thereof.

Figure 8:
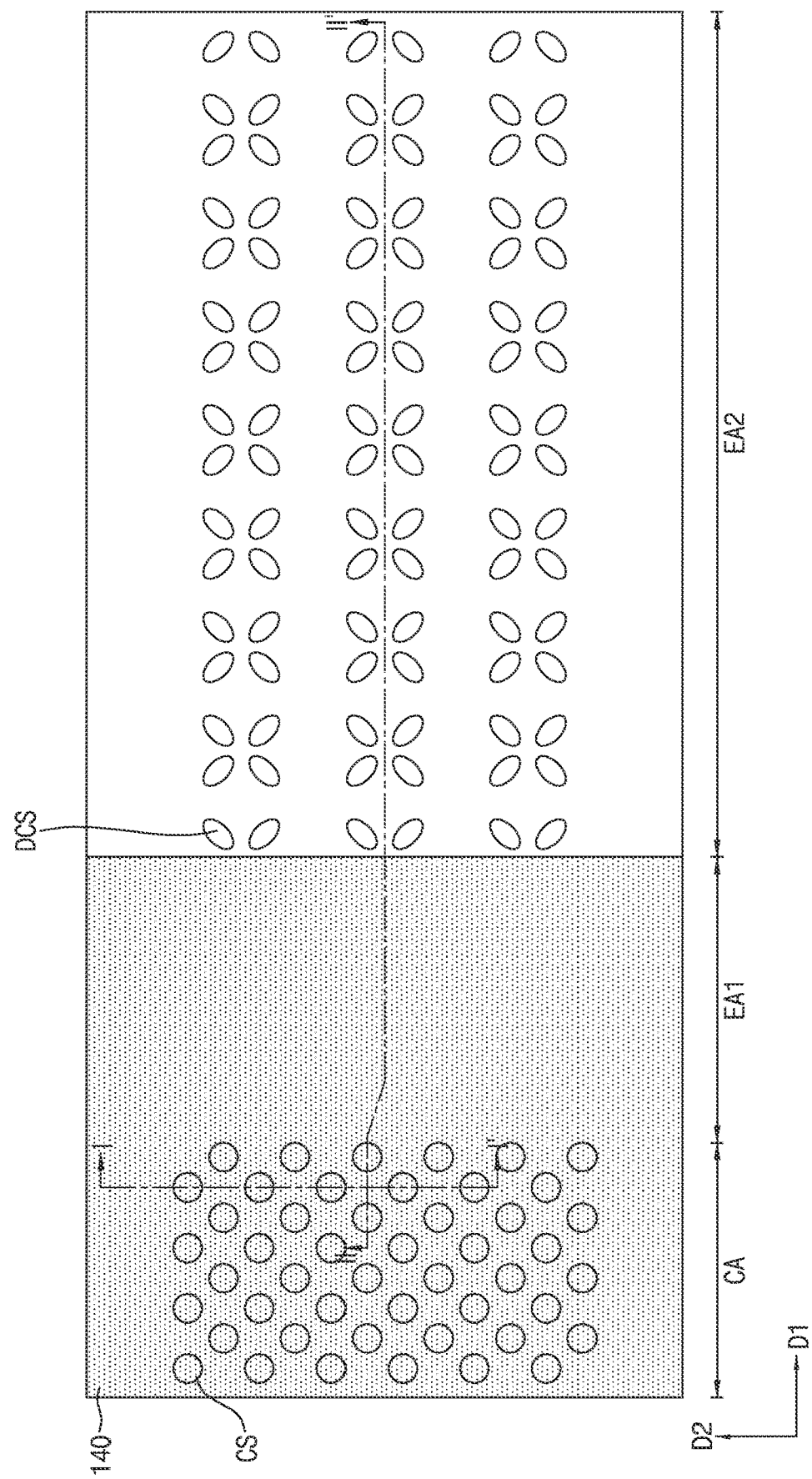
Figure 9A:
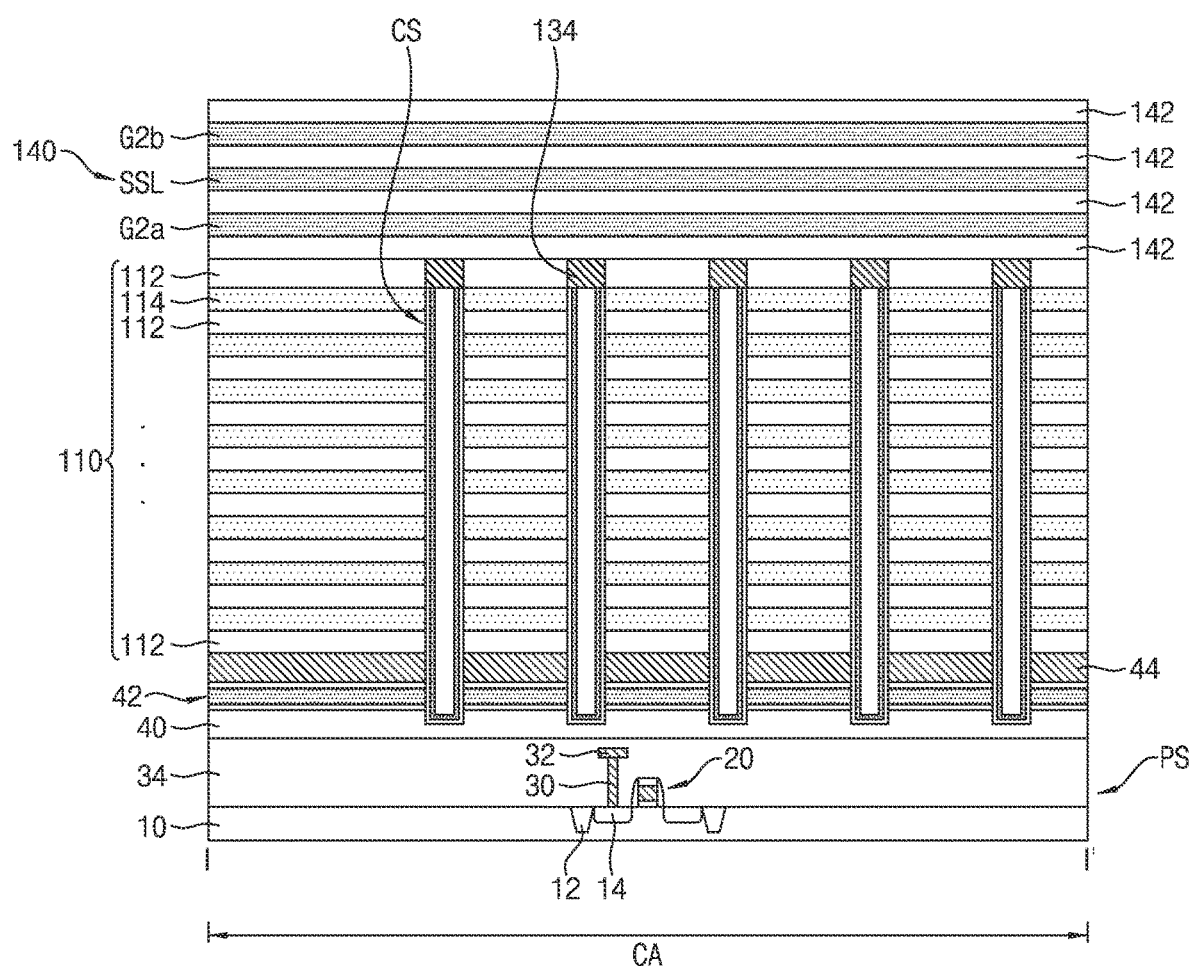

Referring to FIGS. 8, 9A and 9B, an upper gate stack 140 and an upper interlayer insulating layer 144 may be formed on the mold stack 110. The upper gate stack 140 may include upper mold layers 142, a first upper gate electrode G2a, a string selection line SSL, and a second upper gate electrode G2b. The first upper gate electrode G2a, the string selection line SSL, and the second upper gate electrode G2b may be disposed between the upper mold layers 142. The first upper gate electrode G2a may be disposed below the string selection line SSL, and the string selection line SSL may be disposed below the second upper gate electrode G2b. The upper gate stack 140 may be trimmed to form a stair-stepped structure in the first extension region EA1. The upper mold layers 142 may include silicon oxide, and the first upper gate electrode G2a, the string selection line SSL, and the second upper gate electrode G2b may include polysilicon.

The upper interlayer insulating layer 144 may cover the upper gate stack 140 in the first extension region EA1. The upper interlayer insulating layer 144 may include a silicon oxide, silicon nitride, silicon oxynitride, a low-k dielectric material, a high-k dielectric material, or combinations thereof. For example, the upper interlayer insulating layer 144 may include silicon oxide.

Figure 10:
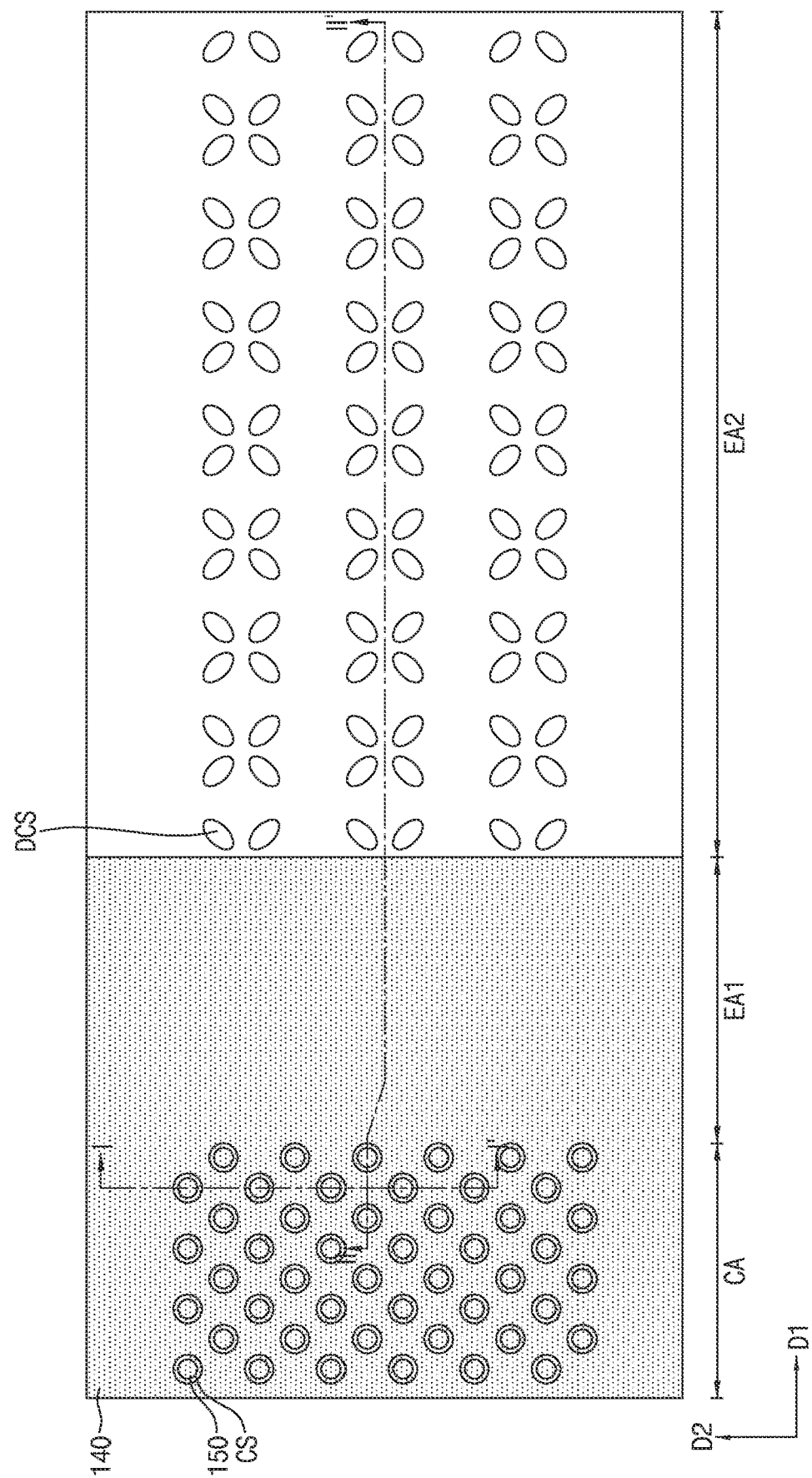
Figure 11A:
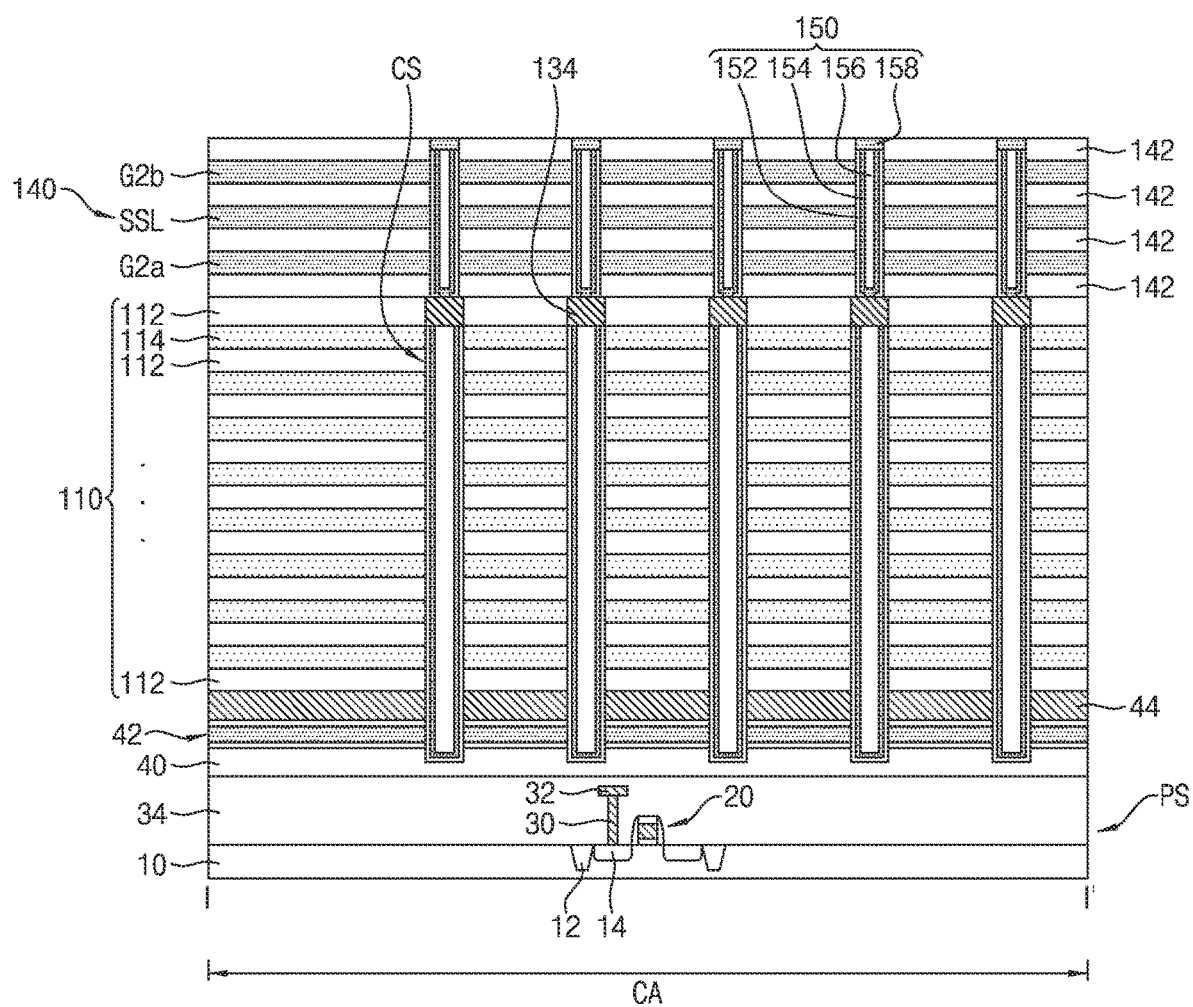
Figure 11B:
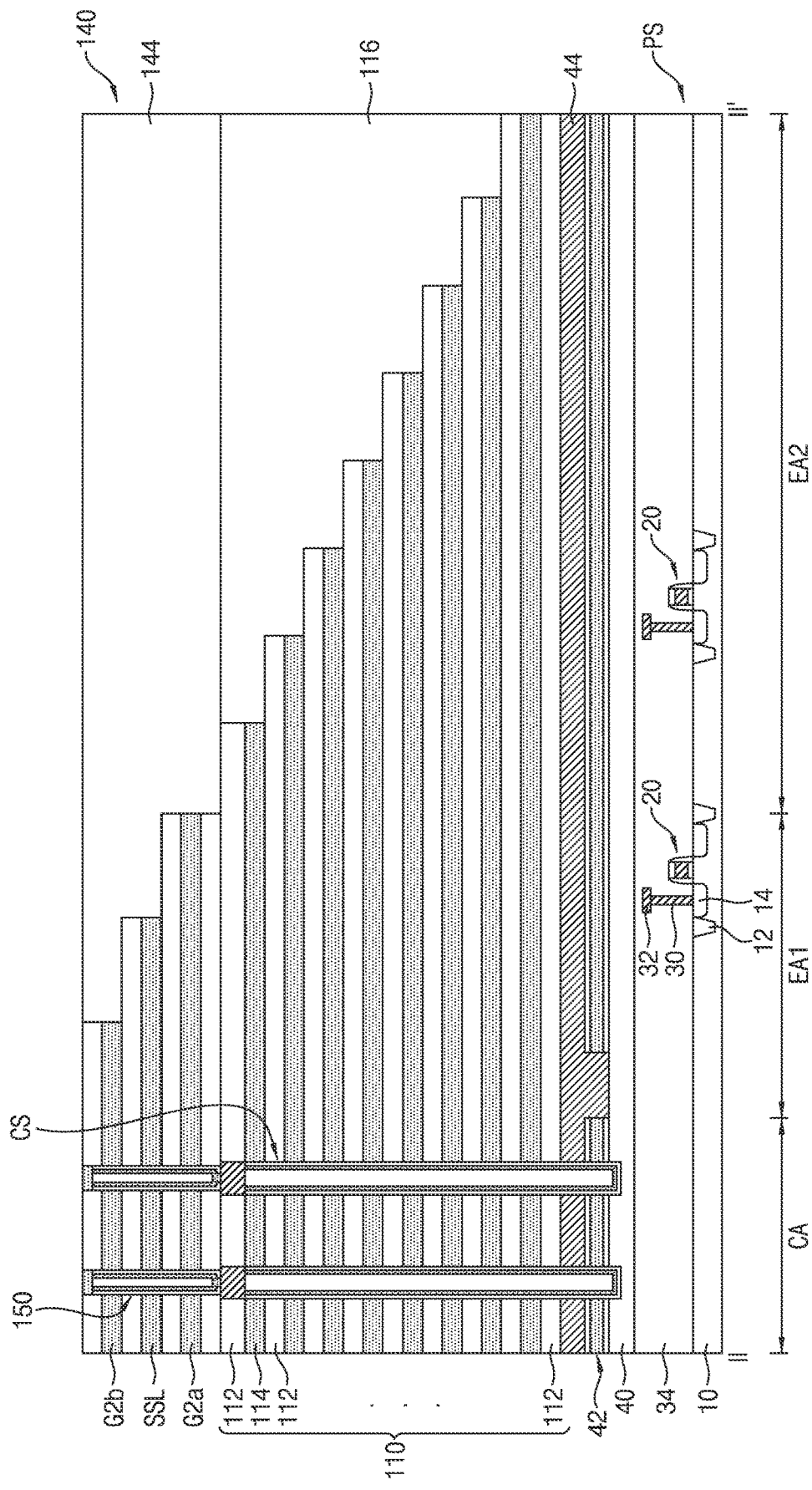

Referring to FIGS. 10, 11A and 11B, channel contacts 150 may be formed in the cell array region CA. The channel contacts 150 may vertically penetrate the upper gate stack 140, and each may be disposed to be vertically aligned with a corresponding one of the channel structures CS. The channel contacts 150 may contact with the conductive pads 134. The channel contact 150 may include a string insulating layer 152, a string channel layer 154, a string buried layer 156, and a string conductive pad 158. The string insulating layer 152 may be disposed between the first upper gate electrode G2a and the string channel layer 154, between the string selection line SSL and the string channel layer 154, and between the second upper gate electrode G2b and the string channel layer 154, and may vertically extend. The string insulating layer 152 may be formed by forming a hole that vertically penetrates the upper gate stack 140, applying an insulating material on the inner wall of the hole, and etching a portion of the bottom surface of the insulating material such that the conductive pad 134 is exposed. The string channel layer 154 may be disposed inside the string insulating layer 152, and may contact with the conductive pad 134. The string buried layer 156 may fill the interior of the string channel layer 154. The string conductive pad 158 may be disposed at the upper side of the channel contact 150. The string insulating layer 152 may include silicon oxide. The string channel layer 154 may include polysilicon. The string buried layer 156 may include silicon oxide, silicon nitride, silicon oxynitride, or combinations thereof. The string conductive pad 158 may include the same material as the first upper gate electrode G2a, the string selection line SSL, and the second upper gate electrode G2b. The string conductive pad 158 may include polysilicon.

Figure 12:
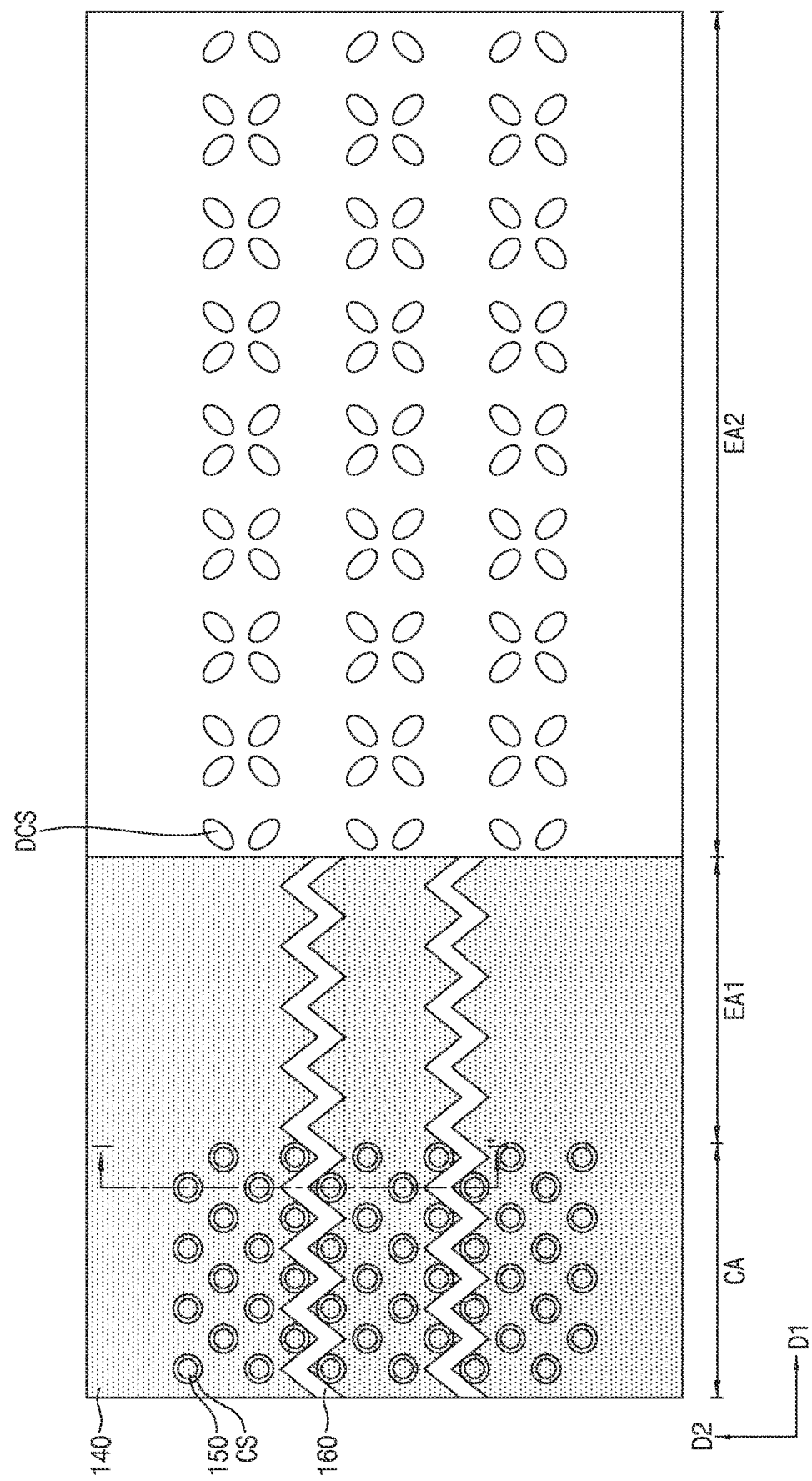
Figure 13:
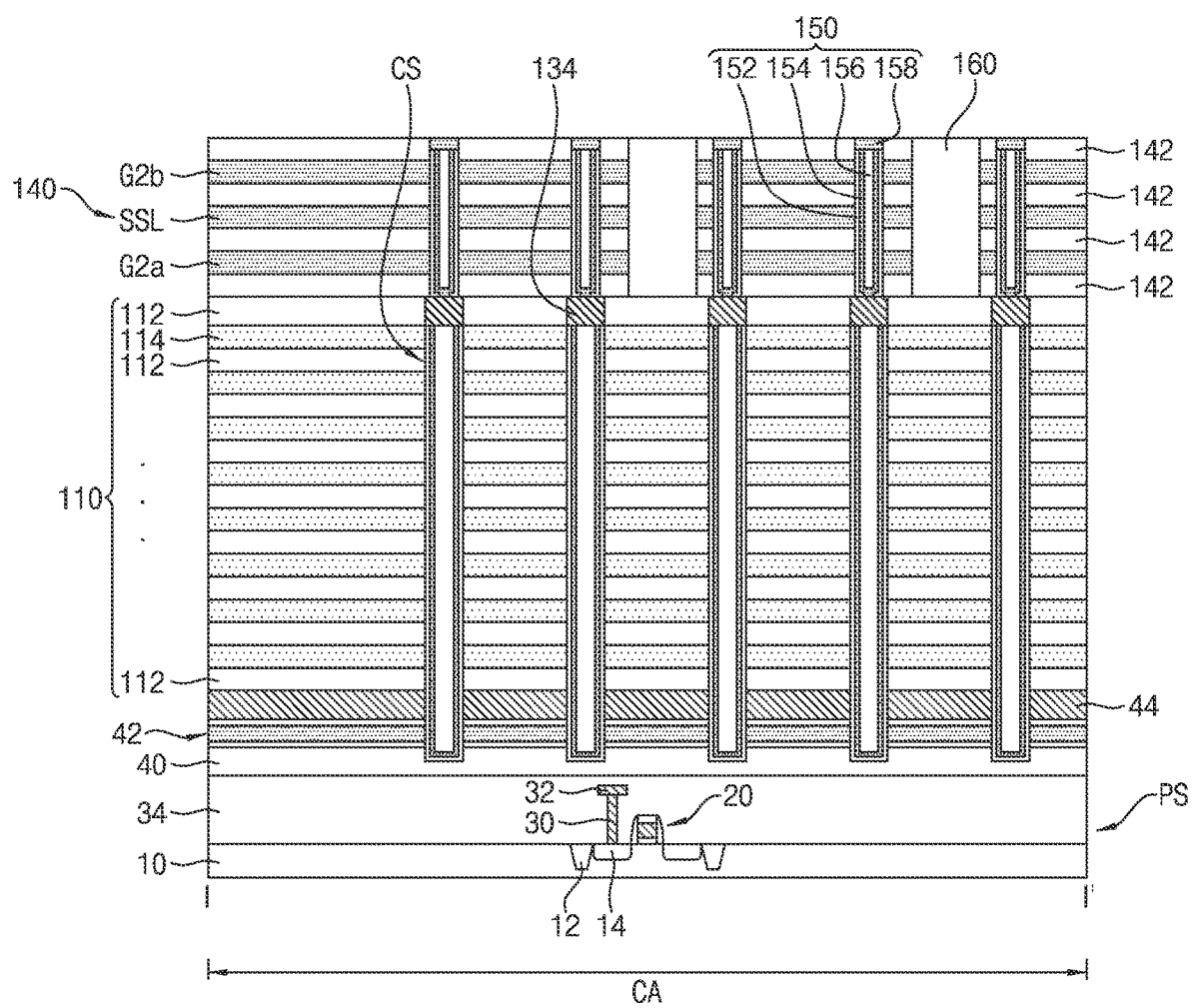

Referring to FIGS. 12 and 13, a string selection line isolation layer 160 may be formed. The string selection line isolation layer 160 may be formed by anisotropically etching the upper gate stack 140 and filling the etched portion with an insulating material. Viewed in plan, the string selection line isolation layer 160 may have a zigzag pattern, and may extend in the first horizontal direction D1. The string selection line isolation layer 160 may vertically penetrate the upper gate stack 140. The string selection line SSL may vertically penetrate the first upper gate electrode G2a, the string selection line SSL, and the second upper gate electrode G2b. A plurality of string selection lines SSL may be spatially isolated by the string selection line isolation layer 160. The string selection line isolation layer 160 may include a silicon oxide, silicon nitride, silicon oxynitride, or combinations thereof.

Figure 14:
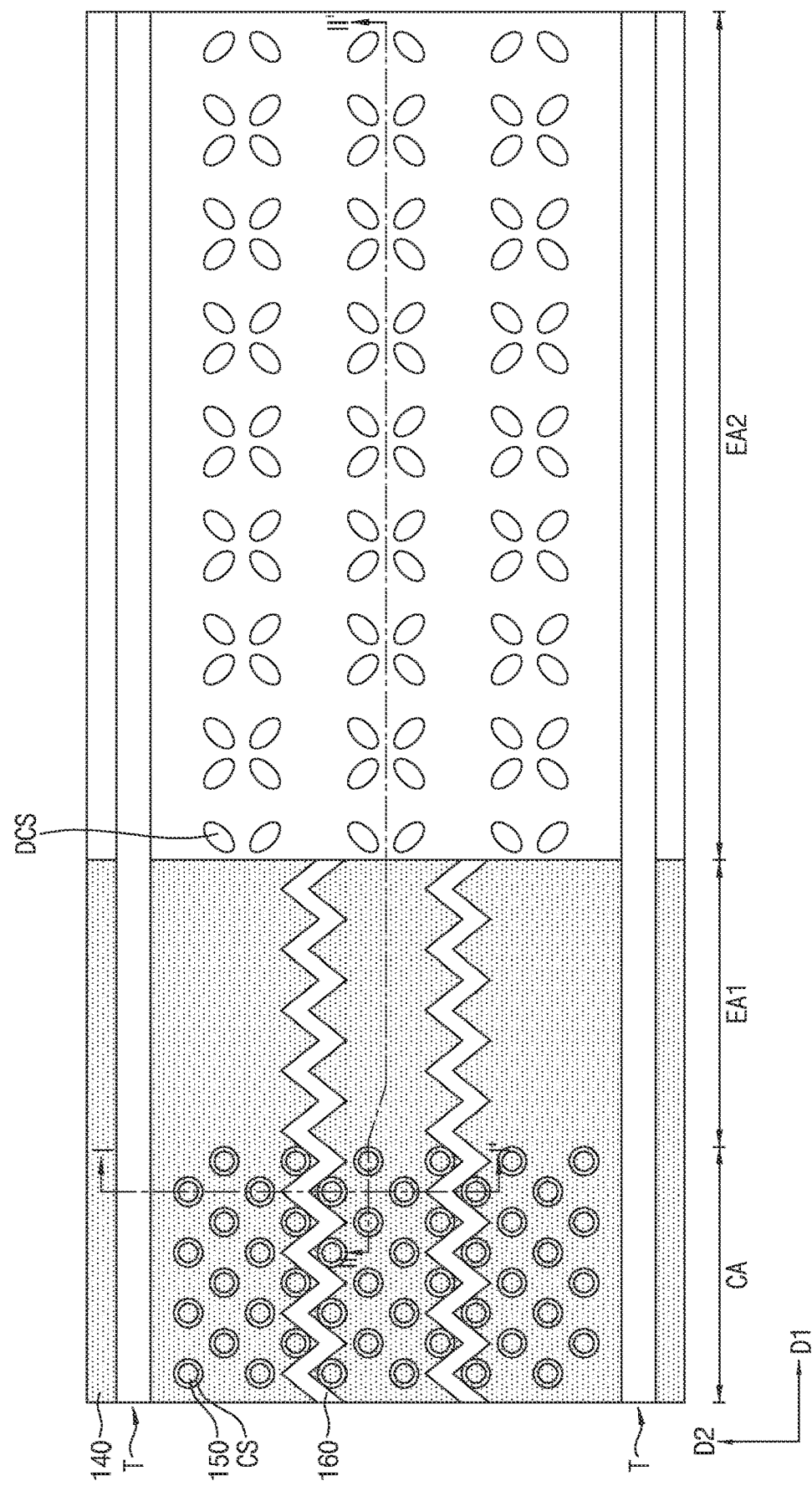
Figure 15A:
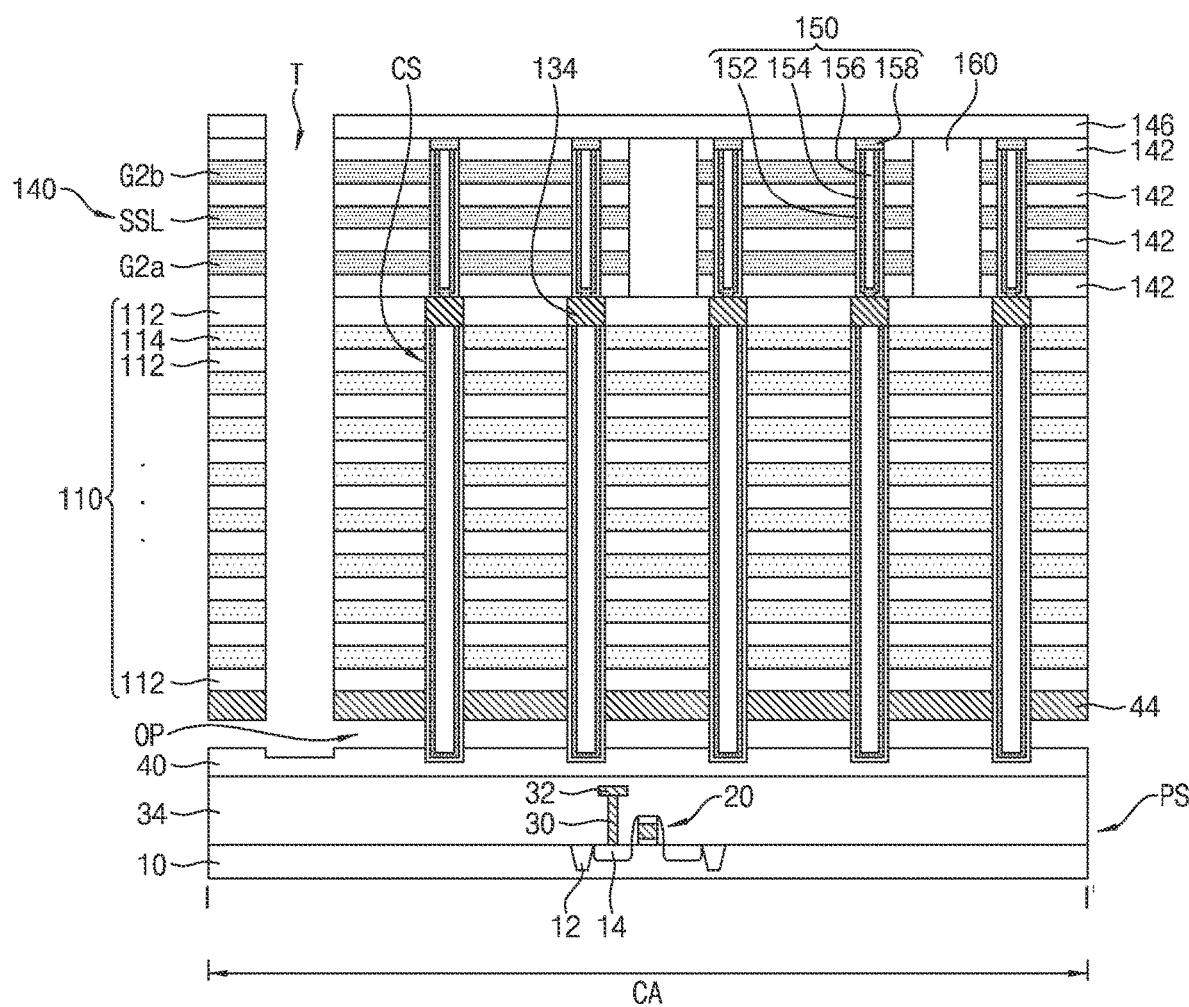
Figure 15B:
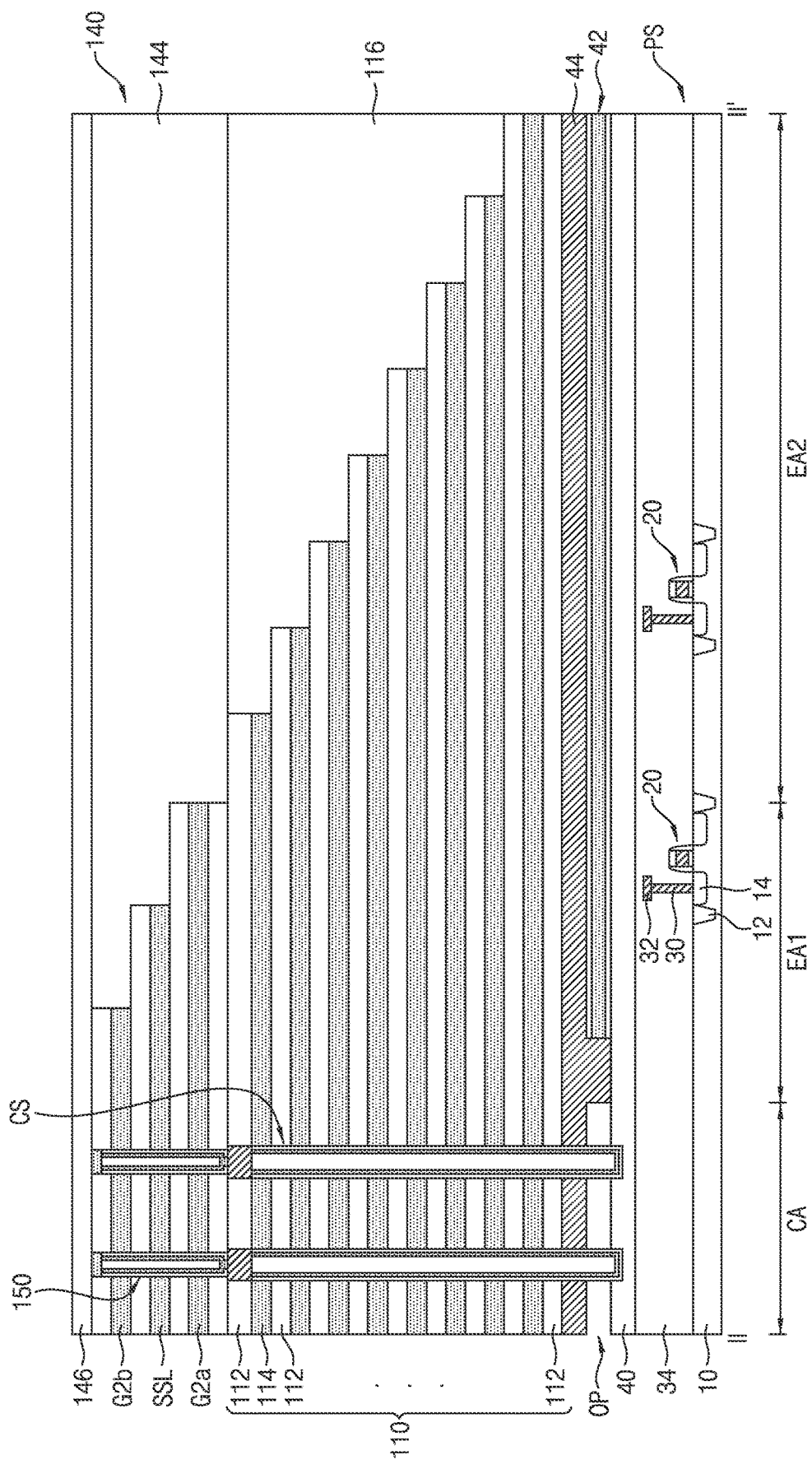

Referring to FIGS. 14, 15A and 15B, a first upper insulating layer 146 and an isolation trench T may be formed. The first upper insulating layer 146 may be disposed on the upper gate stack 140, and may include silicon oxide, silicon nitride, silicon oxynitride, or combinations thereof. The isolation trench T may be formed through an anisotropic etching process, and may vertically penetrate the upper gate stack 140 and the mold stack 110. Viewed in plan, the isolation trench T may extend in the first horizontal direction D1, and may be formed in the cell array region CA, the first extension region EA1, and the second extension region EA2. The isolation trench T may expose the connection mold layer 42, and the portion of the connection mold layer 42 that is disposed in the cell array region CA may be removed. The process of removing the connection mold layer 42 may include an isotropic etching process. The connection mold layer 42 may be removed to form an opening OP between the lower conductive layer 40 and the supporter 44, and the channel structure may be partially exposed. The process of removing the connection mold layer 42 may include a process of forming a spacer for preventing etching of the upper gate stack 140 and the mold stack 110 on the side surface of the isolation trench T.

Figure 16:
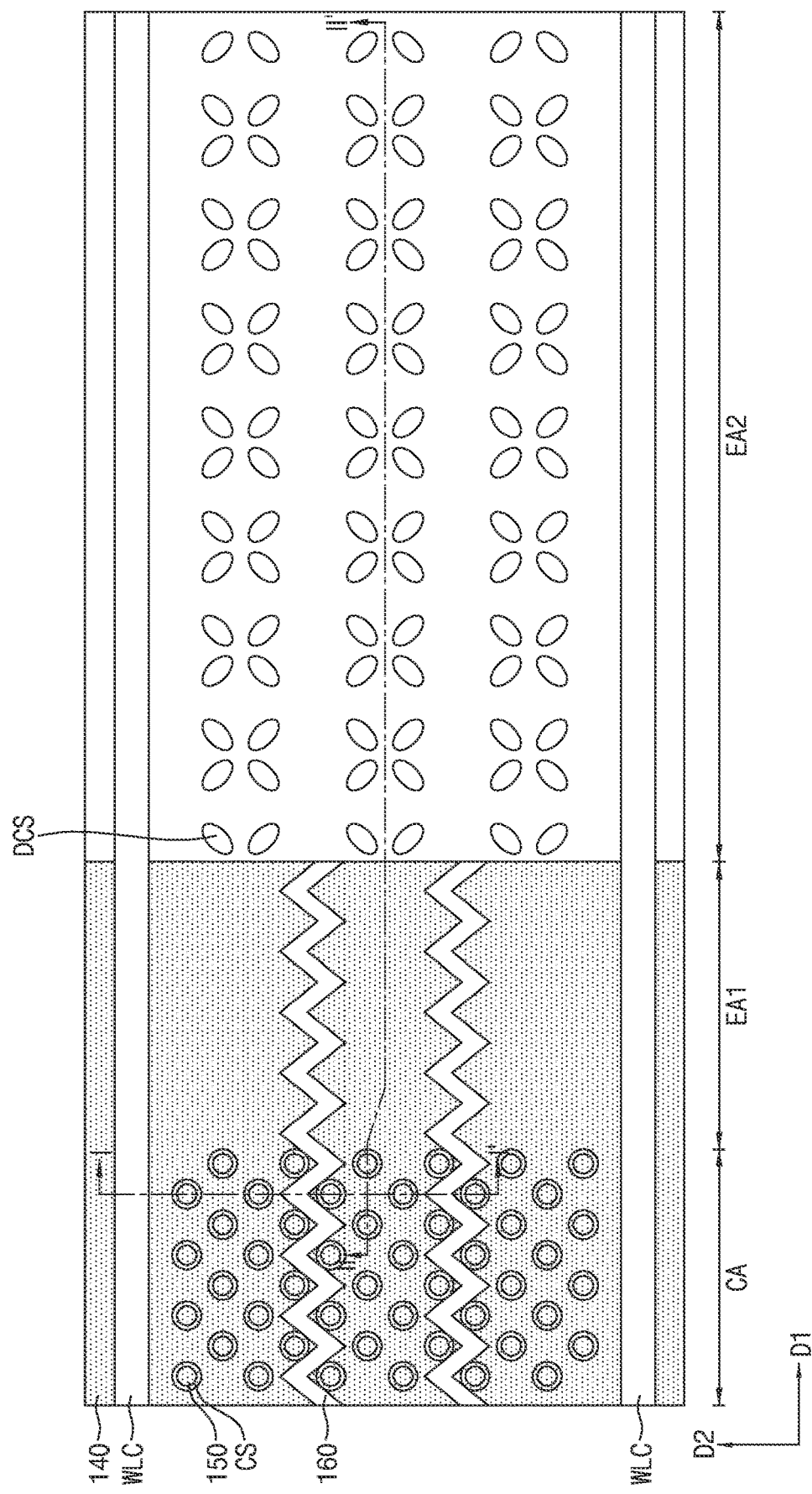
Figure 17A:
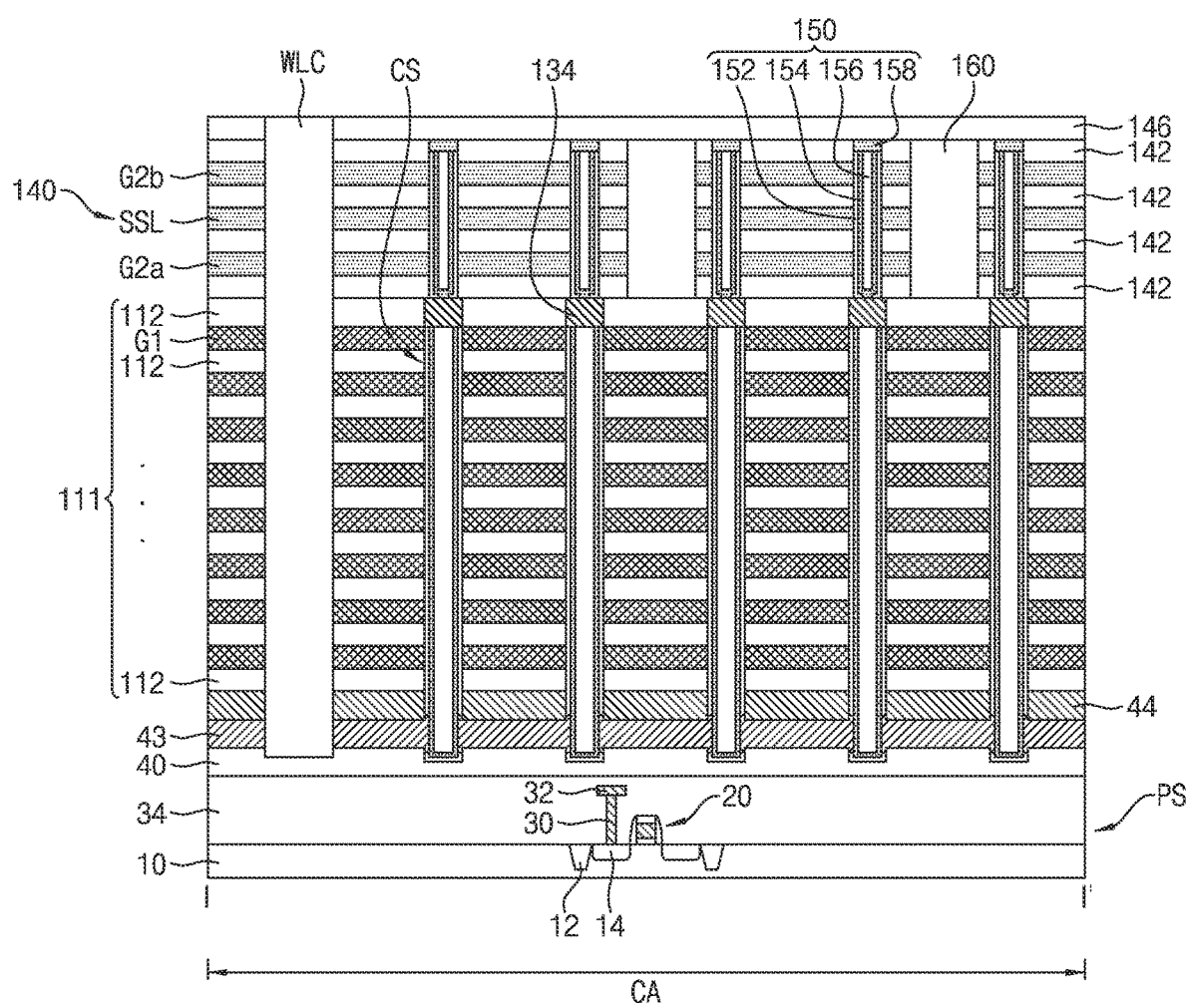
Figure 17B:
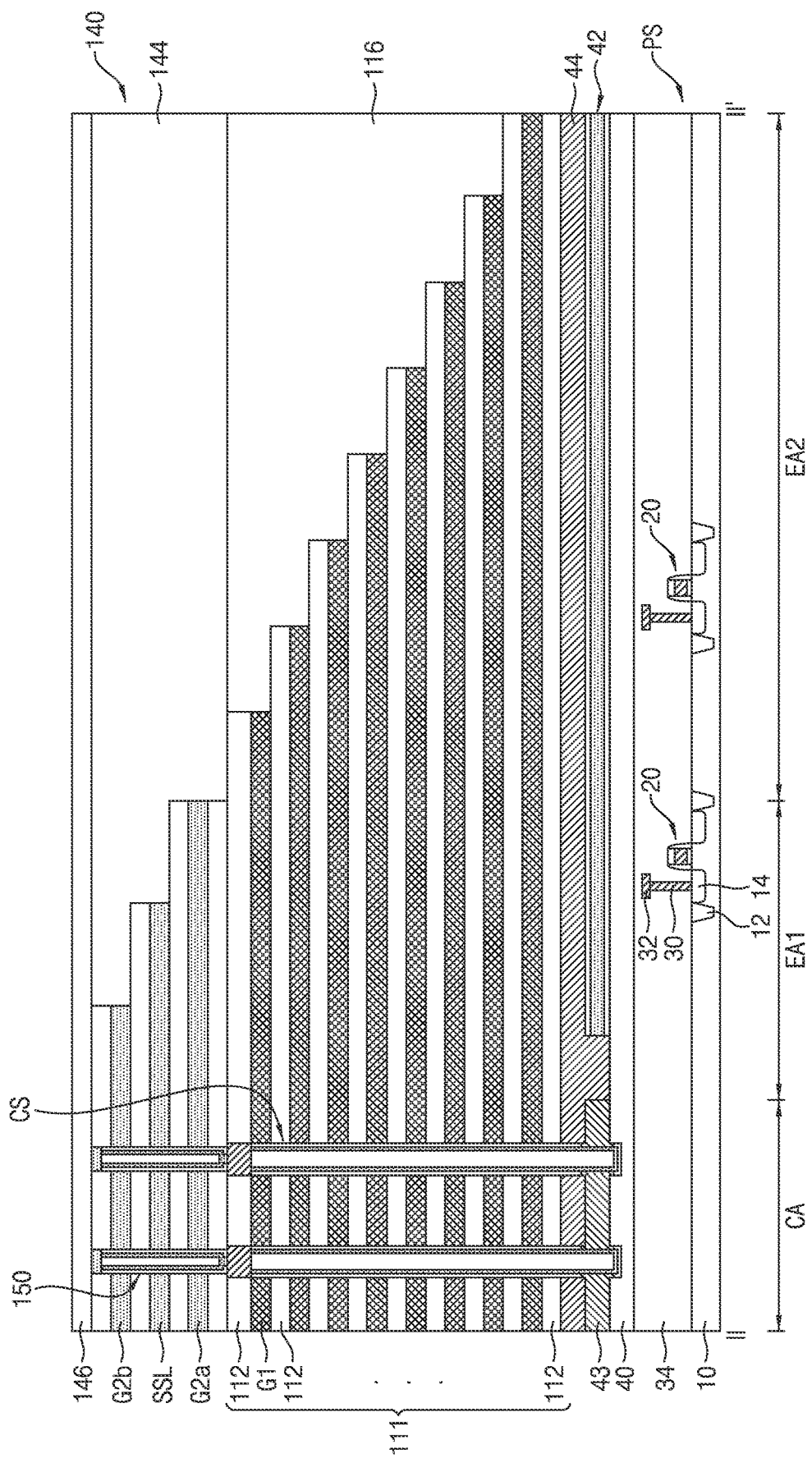

Referring to FIGS. 16, 17A and 17B, a connection conductive layer 43, lower gate electrodes G1, and an isolation insulating layer WLC may be formed. The connection conductive layer 43 may fill the interior of the opening OP. Referring further to FIG. 3, the process of forming the connection conductive layer 43 may include a process of partially etching the information storage layer 120 to expose the channel layer 130 and a process of filling the opening OP with a conductive material such that the conductive material comes into contact with the channel layer 130. The connection conductive layer 43 may include a metal, metal nitride, metal oxide, metal silicide, polysilicon, conductive carbon, or combinations thereof.

After the sacrificial layer 114 is removed, the lower gate electrodes G1 may be formed in the space formed by removal of the sacrificial layer 114. The process of removing the sacrificial layer 114 may include an isotropic etching process. The lower gate electrodes G1 and the lower mold layer 112 may be alternately disposed to constitute the memory stack 111. The lower gate electrodes G1 may include a material different from that of the first upper gate electrode G2a, the string selection line SSL, and the second upper gate electrode G2b. For example, the lower gate electrodes G1 may include tungsten.

The isolation insulating layer WLC may be formed inside the isolation trench T. The isolation insulating layer WLC may vertically penetrate the first upper insulating layer 146, the upper gate stack 140, the memory stack 111, the supporter 44, and the connection conductive layer 43. The isolation insulating layer WLC may extend in the first horizontal direction D1, and may be formed in the cell array region CA, the first extension region EA1, and the second extension region EA2. The isolation insulating layer WLC may include a silicon oxide, silicon nitride, silicon oxynitride, or combinations thereof.

Figure 18:
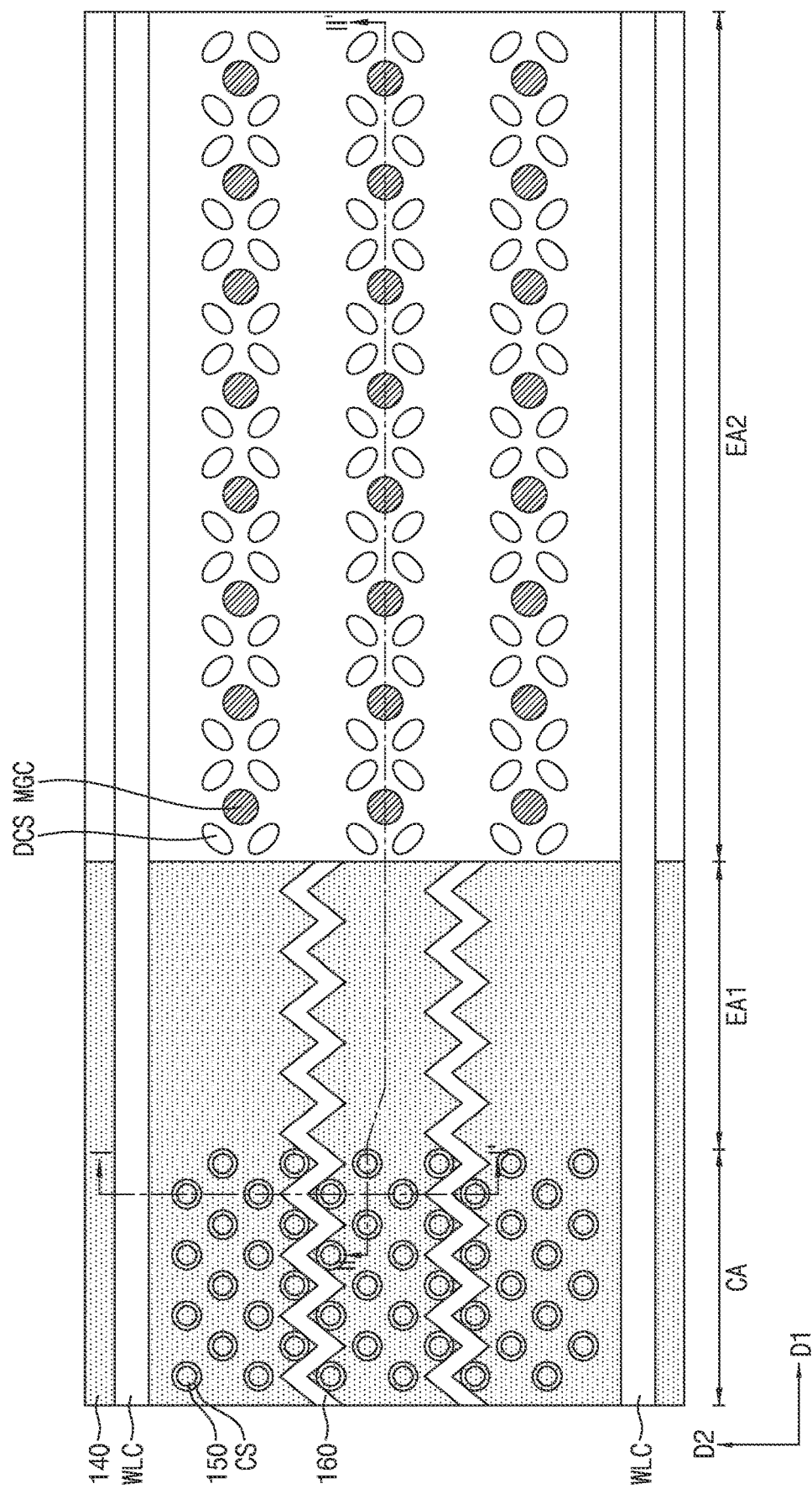
Figure 19A:
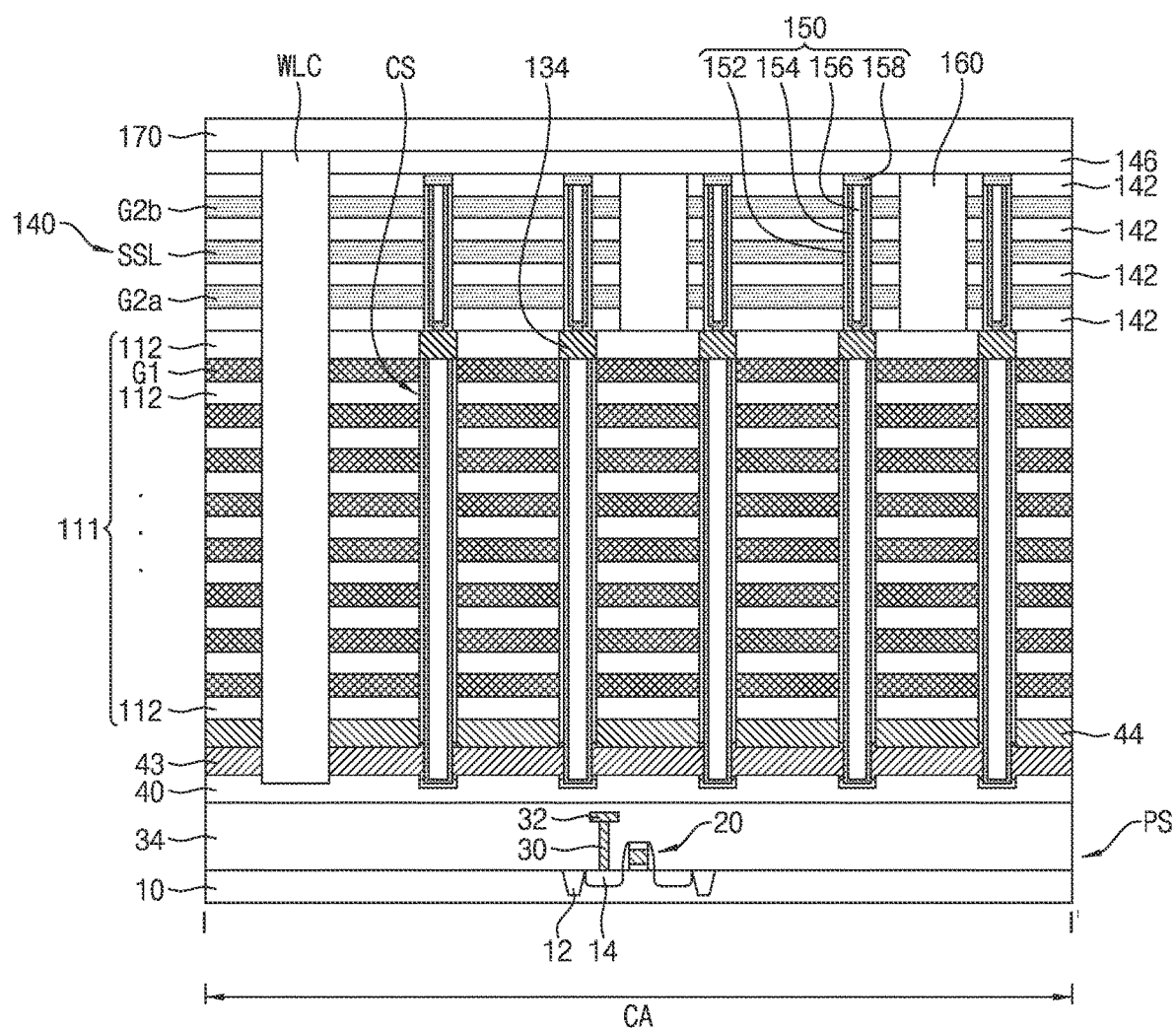
Figure 19B:
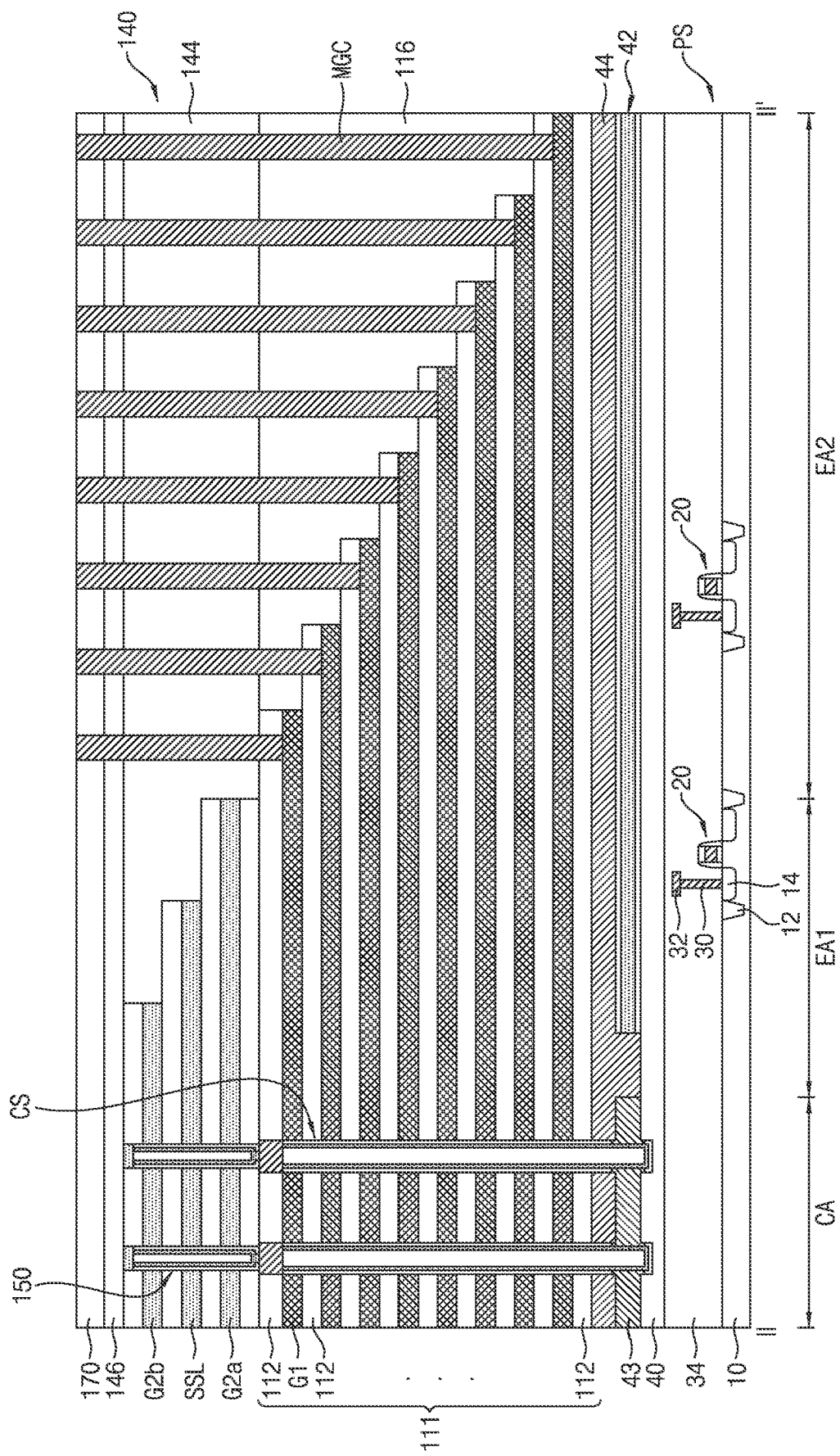

Referring to FIGS. 18, 19A and 19B, a second upper insulating layer 170 and memory gate contacts (MGC) may be formed. The second upper insulating layer 170 may be disposed on the first upper insulating layer 146, and may include a silicon oxide, silicon nitride, silicon oxynitride, or combinations thereof.

The memory gate contacts MGC may be formed between the dummy channel structures DCS in the second extension region EA2. The memory gate contacts MGC may vertically penetrate the upper gate stack 140, the first upper insulating layer 146, and the second upper insulating layer 170, and may partially penetrate the memory stack 111. Each of the memory gate contacts MGC may be connected to a corresponding one of the lower gate electrodes G1. The memory gate contact MGC may include a material different from that of the first upper gate electrode G2a, the string selection line SSL, and the second upper gate electrode G2b. For example, the memory gate contact MGC may include tungsten.

Figure 20:
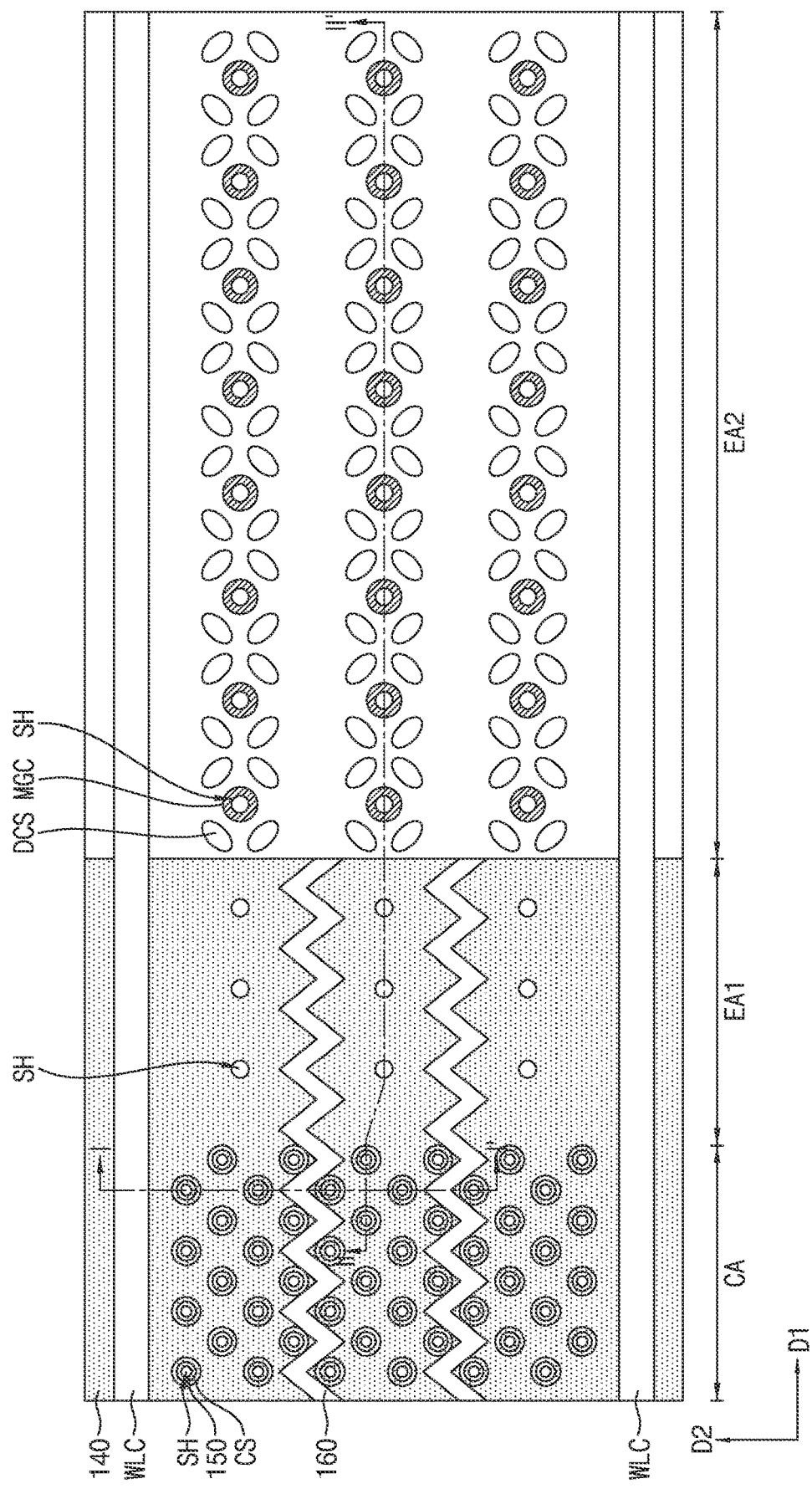
Figure 21A:
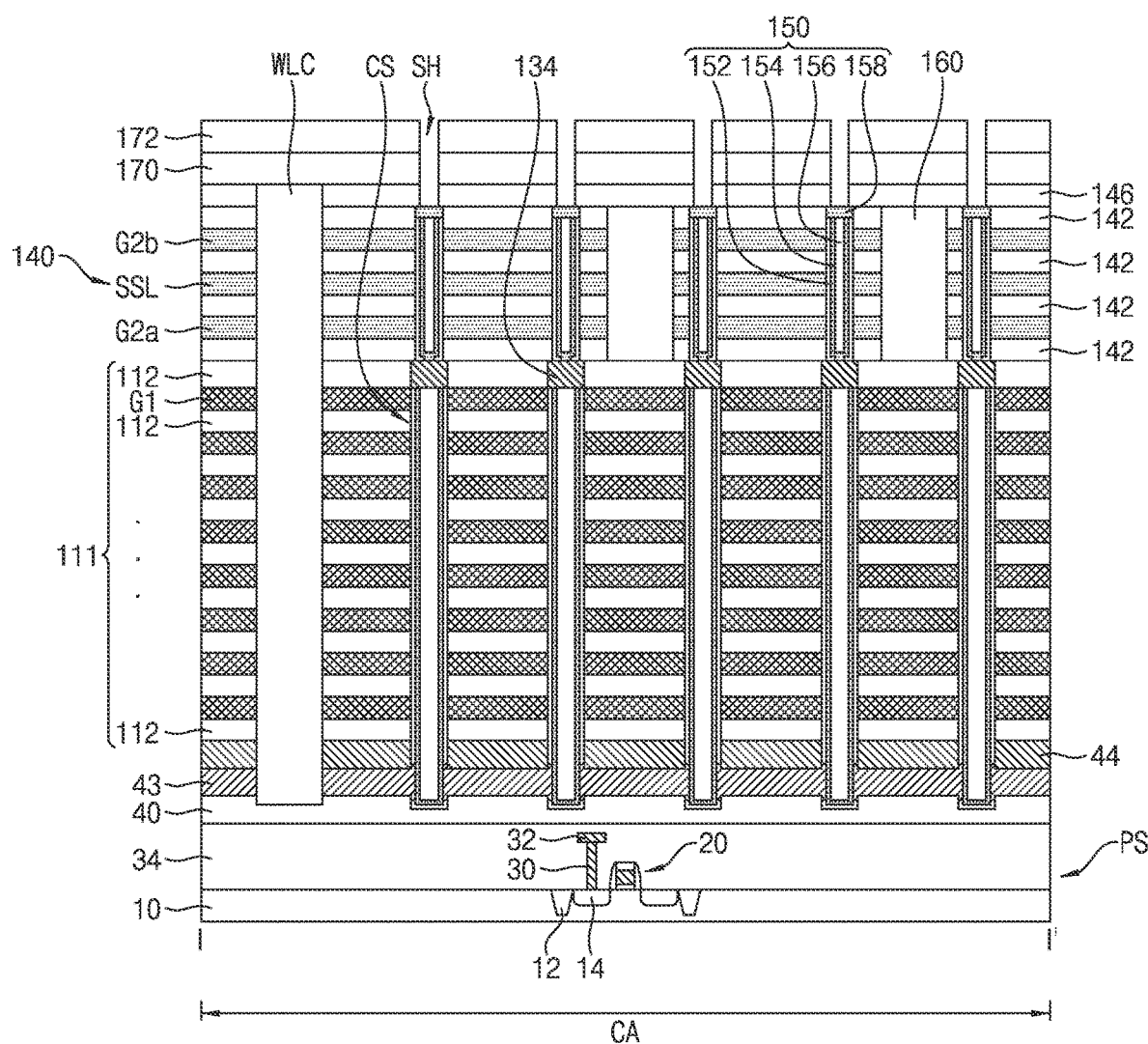
Figure 21B:
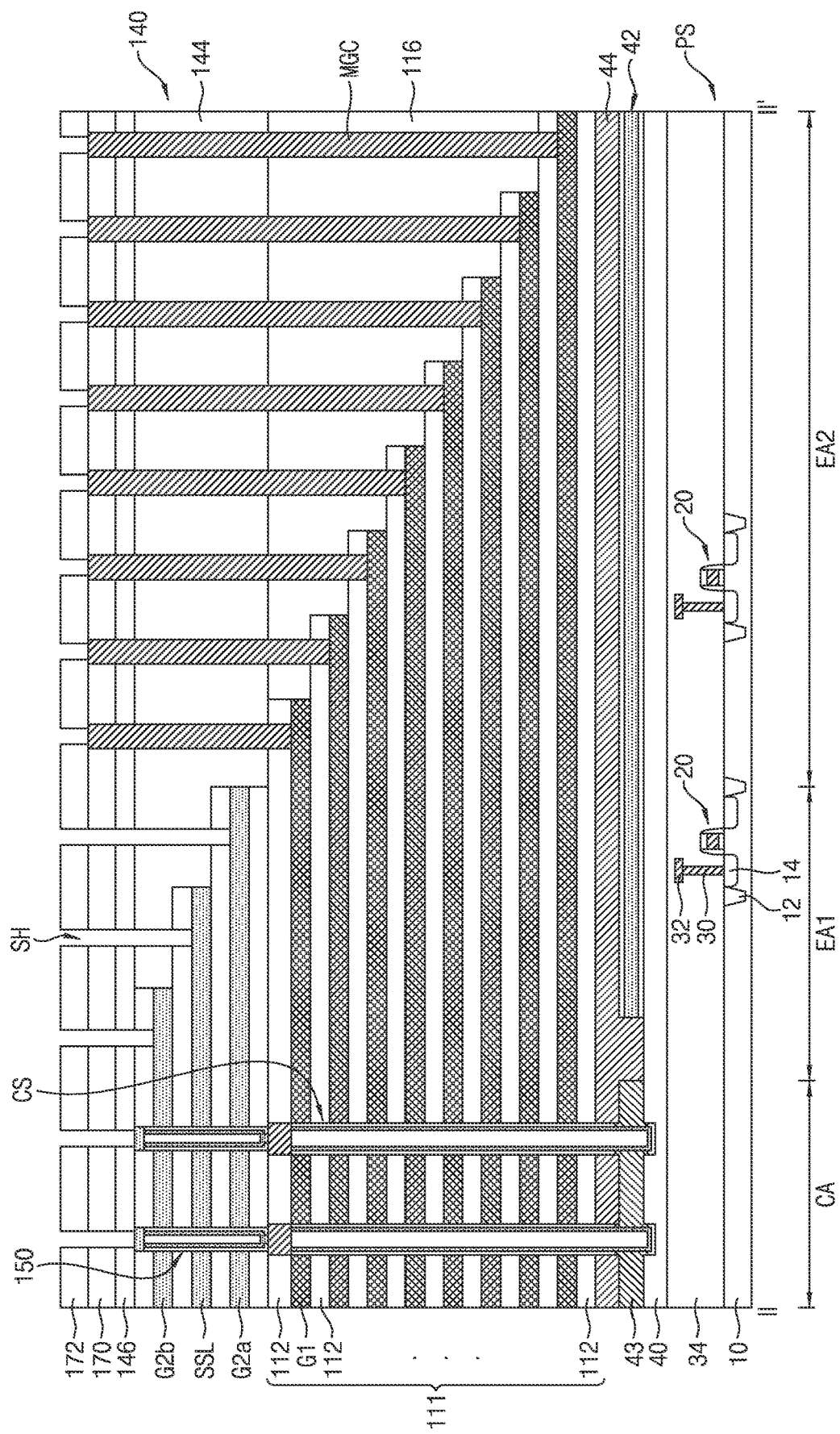

Referring to FIGS. 20, 21A and 21B, a third upper insulating layer 172 and stud holes SH may be formed. The third upper insulating layer 172 may be disposed on the second upper insulating layer 170, and may include a silicon oxide, silicon nitride, silicon oxynitride, or combinations thereof.

The stud holes SH may be formed through an anisotropic etching process, and may vertically extend from the third upper insulating layer 172. The vertically extending stud holes SH may be formed in the cell array region CA, the first extension region EA1, and the second extension region EA2, and may expose the channel contact 150, the first upper gate electrode G2a, the string selection line SSL, the second upper gate electrode G2b, and the memory gate contacts MGC. The stud holes SH may not completely penetrate the first upper gate electrode G2a, the string selection line SSL, and the second upper gate electrode G2b.

Referring again to FIGS. 1, 2A and 2B, channel studs CHS, lower studs G1S, a selection line stud SLS, a first upper stud G2Sa, and a second upper stud G2Sb may be formed (in a vertically extending manner) in the stud holes SH. The channel studs CHS may be formed on the channel contacts 150 in the cell array region CA, and may be electrically connected to the channel structures CS via the channel contact 150. The lower studs G1S may be formed on the memory gate contacts MGC in the second extension region EA2, and may be electrically connected to the lower gate electrodes G1 via the memory gate contacts MGC. The selection line stud SLS, the first upper stud G2Sa, and the second upper stud G2Sb may be connected to the string selection line SSL, the first upper gate electrode G2a, and the second upper gate electrode G2b, respectively, in the first extension region EA1. The selection line stud SLS, the first upper stud G2Sa, and the second upper stud G2Sb may include the same material as the first upper gate electrode G2a, the string selection line SSL, and the second upper gate electrode G2b. For example, the channel studs CHS, the lower studs G1S, the selection line stud SLS, the first upper stud G2Sa, and/or the second upper stud G2Sb may include polysilicon.

As shown in FIGS. 18, 19A, 19B, 20, 21A and 21B, the memory gate contacts MGC may be formed through a separate process from the selection line stud SLS. For example, the process of anisotropically etching the upper gate stack 140 to form the selection line stud SLS may be performed after the process of anisotropically etching the upper gate stack 140 to form the memory gate contact MGC. Thus, in the process of forming the memory gate contact MGC, the first upper gate electrode G2a, the string selection line SSL, and the second upper gate electrode G2b need not be punched through.

Figure 22:
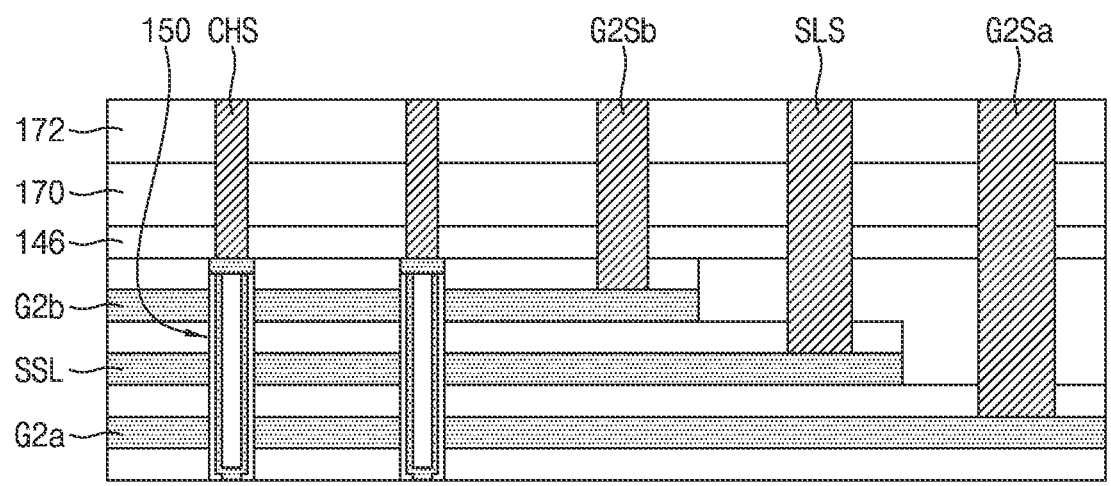
FIG. 22 is an enlarged view of a semiconductor device according to embodiments of the inventive concept.

FIG. 22 is an enlarged view of a semiconductor device according to embodiments of the inventive concept.

Referring to FIG. 22, a semiconductor device 200 may include a first upper stud G2Sa, a selection line stud SLS, and a second upper stud G2Sb, which are connected to the first upper gate electrode G2a, the string selection line SSL, and the second upper gate electrode G2b. In a longitudinal sectional view, the first upper stud G2Sa, the selection line stud SLS, and the second upper stud G2Sb may be relatively thicker than the channel stud CHS. That is, the first upper stud G2Sa, the selection line stud SLS, and the second upper stud G2Sb may be different thicknesses. For example, the first upper stud G2Sa may be thicker than the selection line stud SLS, and the selection line stud SLS may be relatively thicker than the second upper stud G2Sb. In this regard, the term "thicker" may be determined (or measured) according to a longitudinal sectional view.

Figure 23:
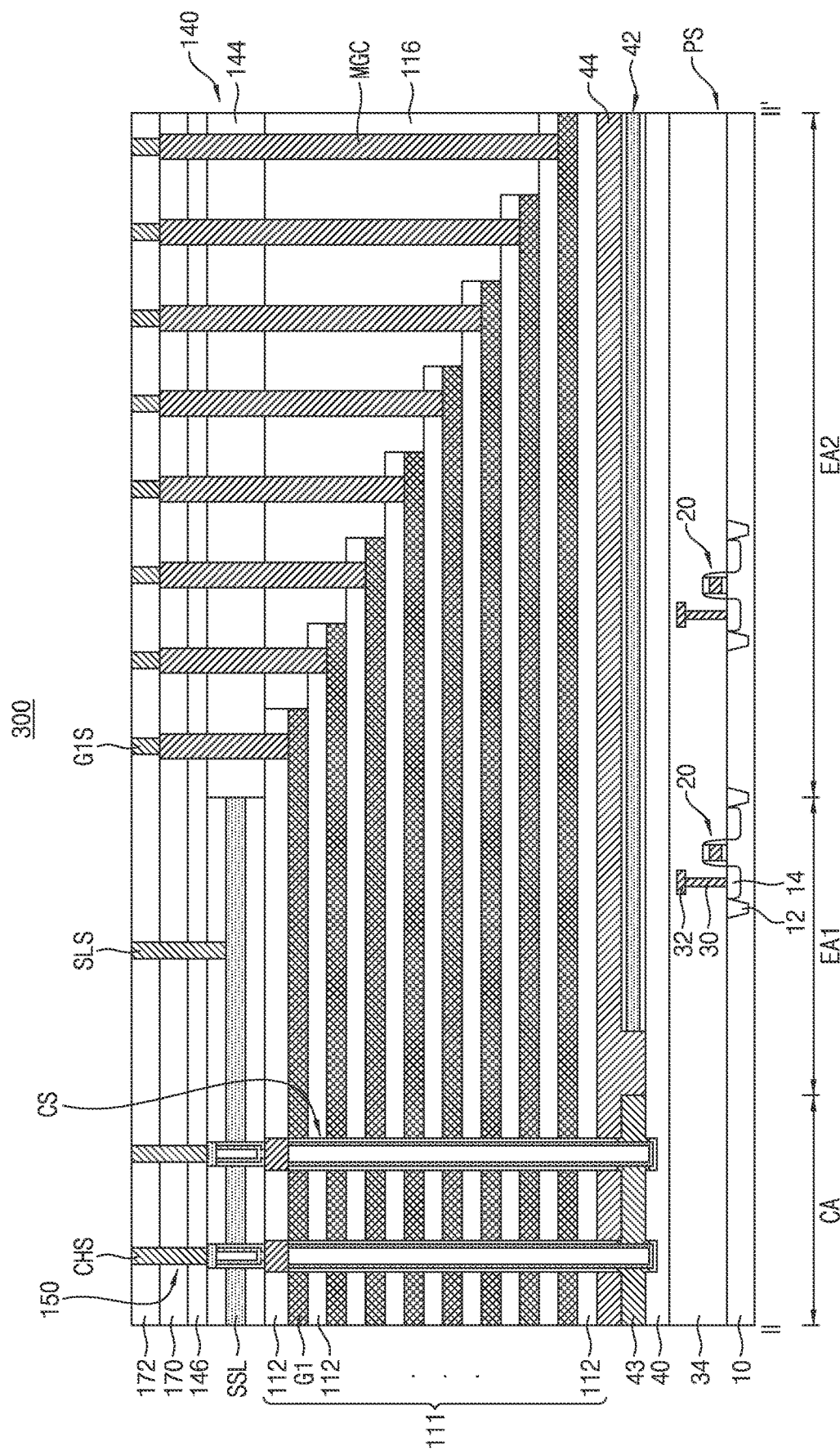
FIGS. 23, 24 and 25 are cross-sectional views of semiconductor devices according to embodiments of the inventive concept.
Figure 25:
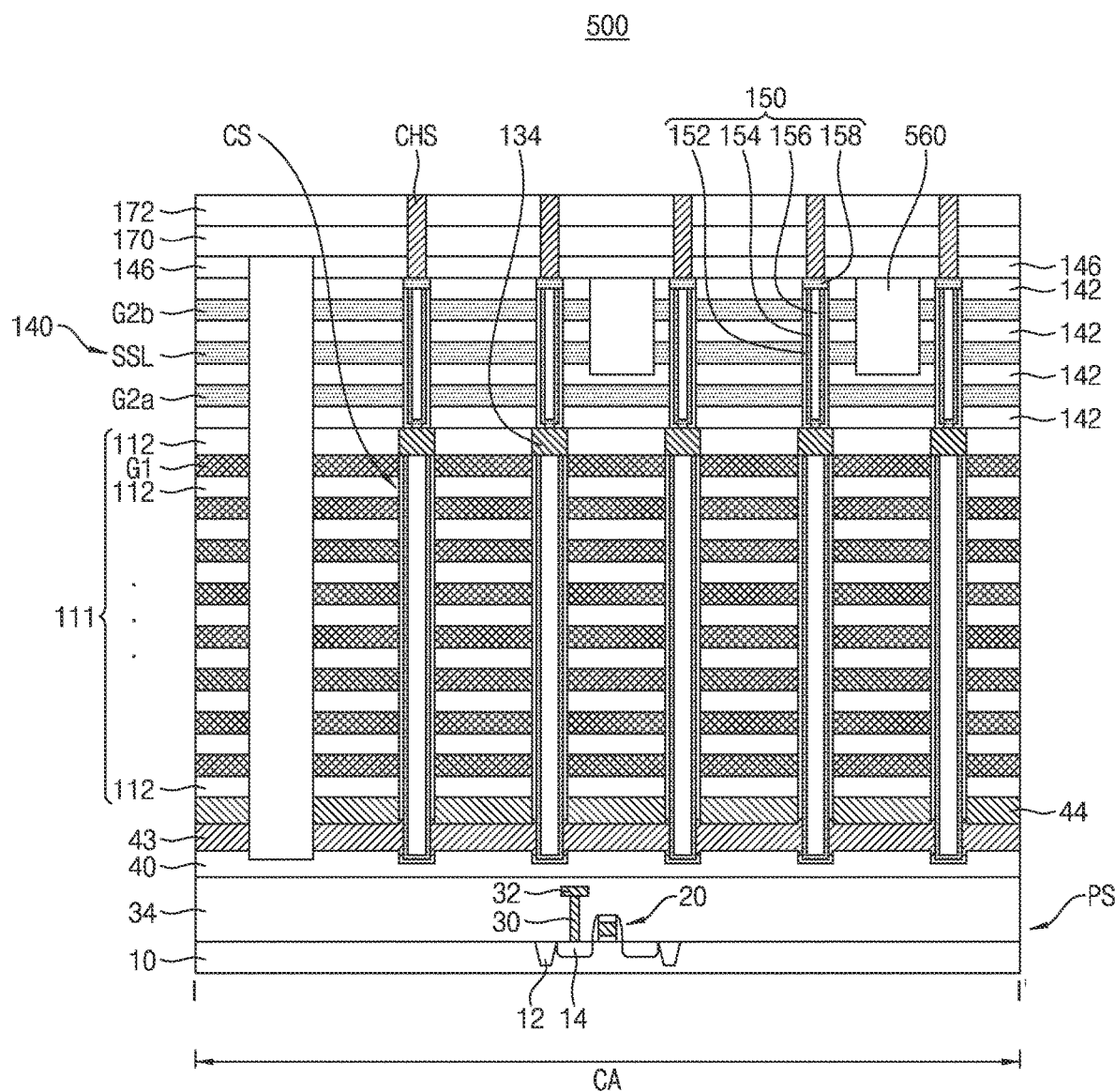

FIGS. 23, 14 and 25 are cross-sectional views of semiconductor devices according to embodiments of the inventive concept.

Referring to FIG. 23, a semiconductor device 300 may include a string selection line SSL and a selection line stud SLS connected to the string selection line SSL. The upper gate stack 140 may include a single gate electrode layer. The string selection line SSL may be used to select a cell string and to erase a memory.

Figure 24:
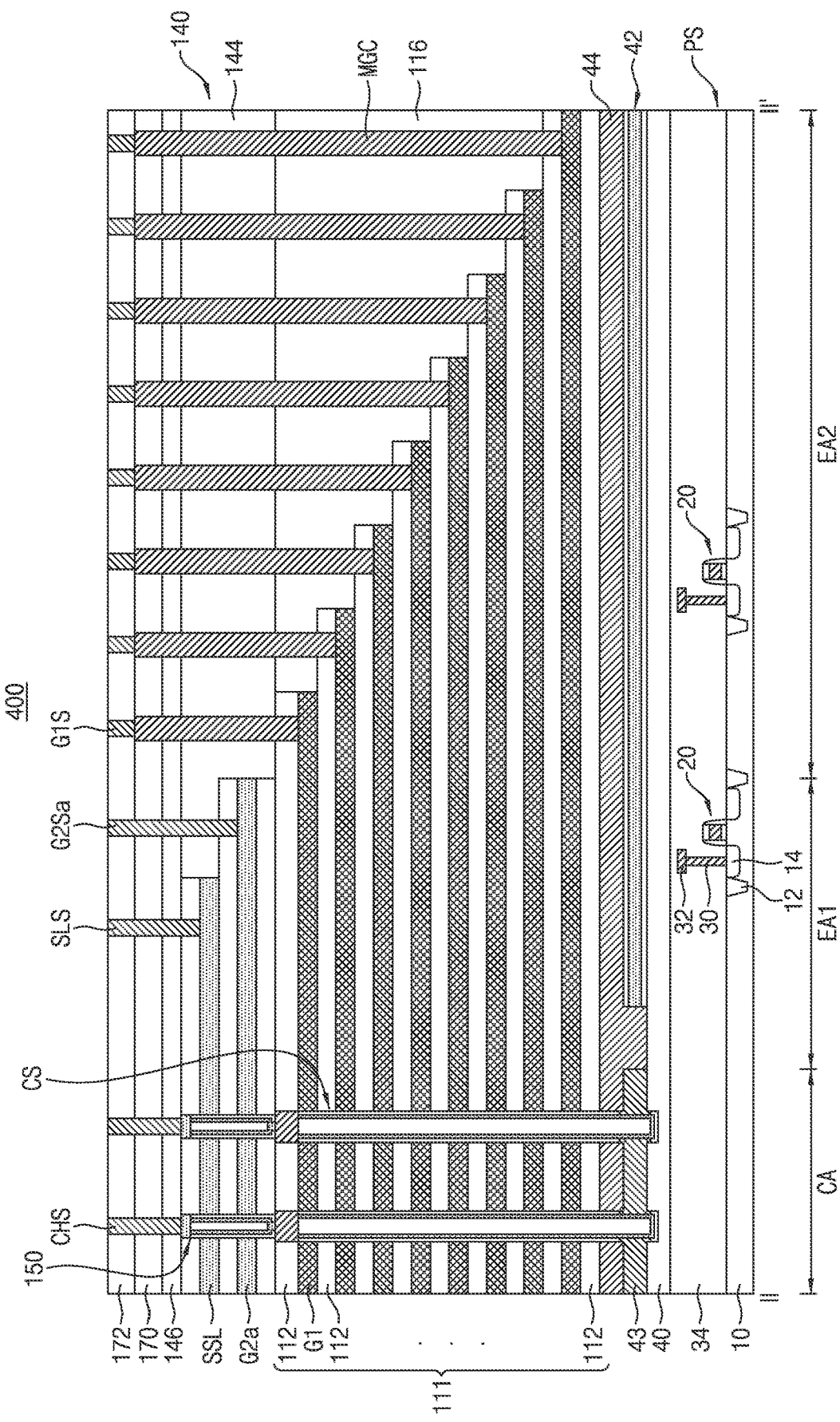

Referring to FIG. 24, a semiconductor device 400 may include a first upper gate electrode G2a and a string selection line SSL, and may further include a first upper stud G2Sa and a selection line stud SLS, which are connected to the first upper gate electrode G2a and the string selection line SSL. The string selection line SSL may be used to select a cell string and to erase a memory. The first upper gate electrode G2a may be used as a dummy line that maintains the threshold voltage of the string selection line SSL constant.

Referring to FIG. 25, a semiconductor device 500 may include a string selection line isolation layer 560 that vertically penetrates the string selection line SSL. The string selection line isolation layer 560 may not completely penetrate the upper gate stack 140. For example, the string selection line isolation layer 560 may penetrate the string selection line SSL and the second upper gate electrode G2b, but may not penetrate the first upper gate electrode G2a.

Figure 26:
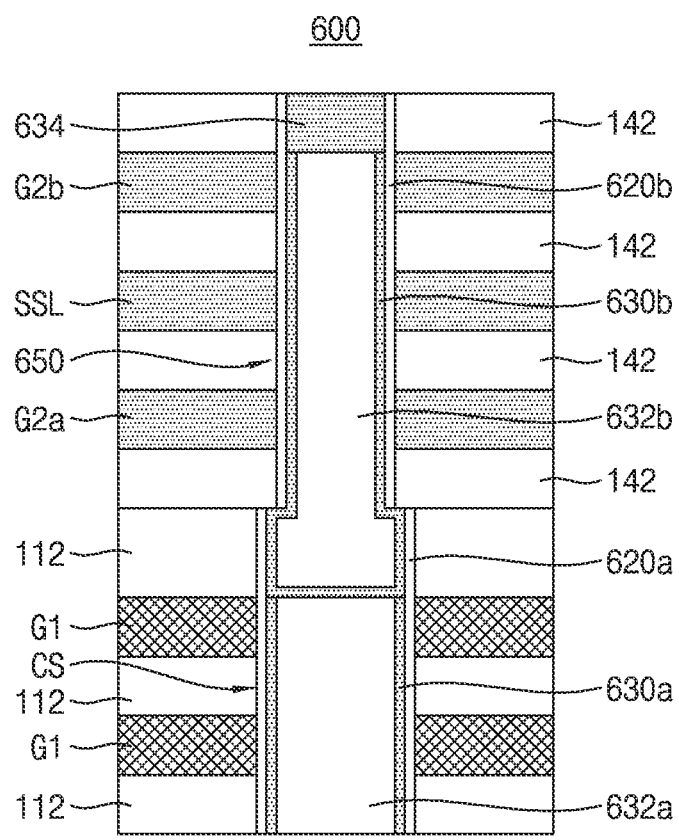
FIG. 26 is an enlarged view of a semiconductor device according to embodiments of the inventive concept.

FIG. 26 is an enlarged view of a semiconductor device according to embodiments of the inventive concept.

Referring to FIG. 26, a semiconductor device 600 may include a channel structure CS and a channel contact 650 disposed on the channel structure CS. The channel structure CS may include an information storage layer 620a, a channel layer 630a, and a buried insulating pattern 632a. The information storage layer 620a may function as an outer wall of the channel structure CS so as to surround the other components of the channel structure CS. The channel layer 630a may vertically extend from the inside of the information storage layer 620a, and the buried insulating pattern 632a may fill the interior of the channel layer 630a.

The channel contact 650 may include a string insulating layer 620b, a string channel layer 630b, a string buried layer 632b, and a string conductive pad 634. The string insulating layer 620b may be disposed between the first upper gate electrode G2a and the string channel layer 630b, between the string selection line SSL and the string channel layer 630b, and between the second upper gate electrode G2b and the string channel layer 630b, and may vertically extend. The string channel layer 630b may be disposed inside the string insulating layer 620b, and may extend to the interior of the channel structure CS. For example, the string channel layer 630b may contact with the inner wall of the information storage layer 620a, the top surface of the channel layer 630a, and the top surface of the buried insulating pattern 632a. The string buried layer 632b may fill the interior of the string channel layer 630b. The string conductive pad 634 may be disposed on the channel contact 650. The string conductive pad 634 may be electrically connected to the channel layer 630a via the string channel layer 630b.

Figure 27:
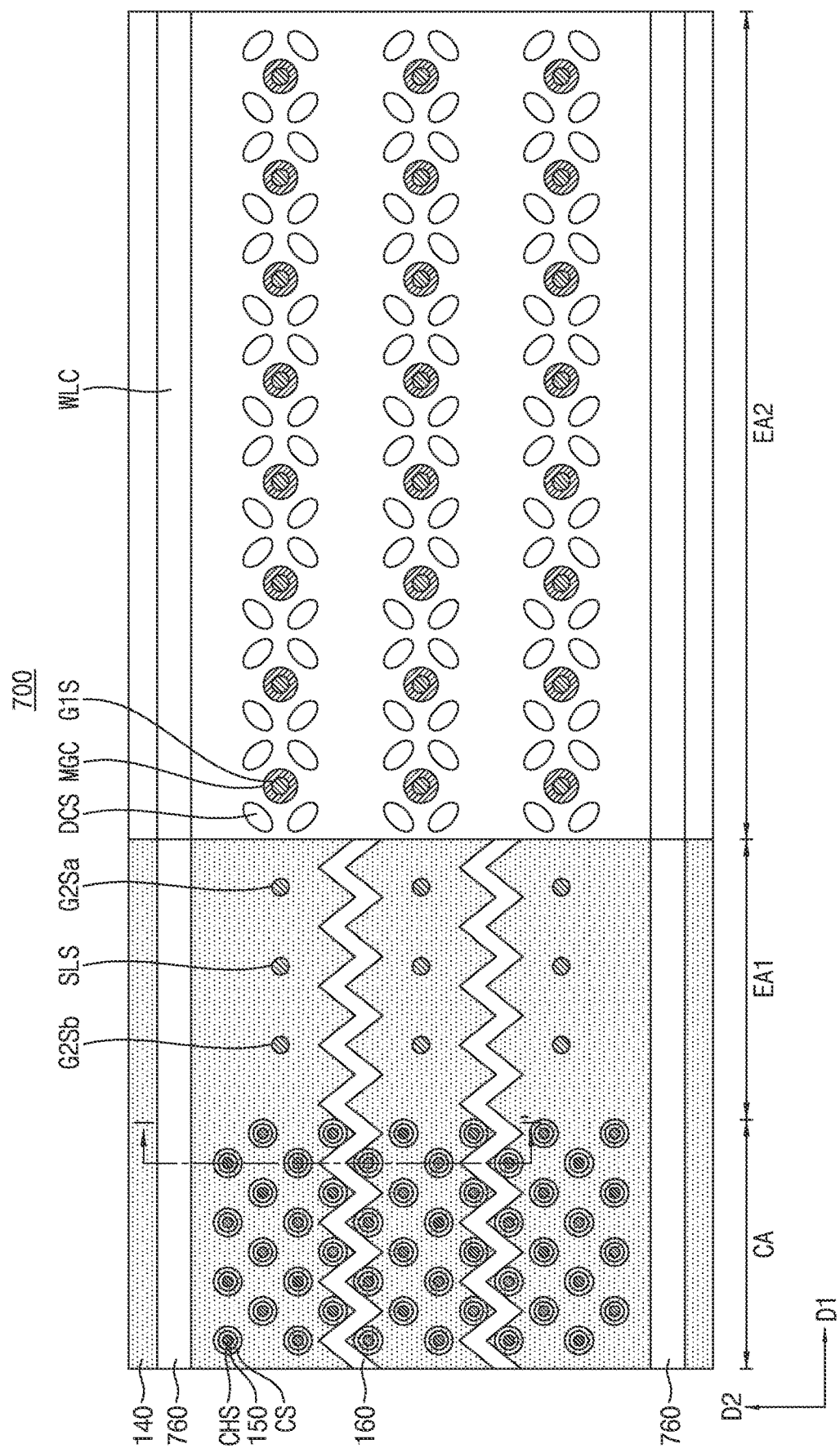
FIG. 27 is a layout of a semiconductor device according to embodiments of the inventive concept.
Figure 28:
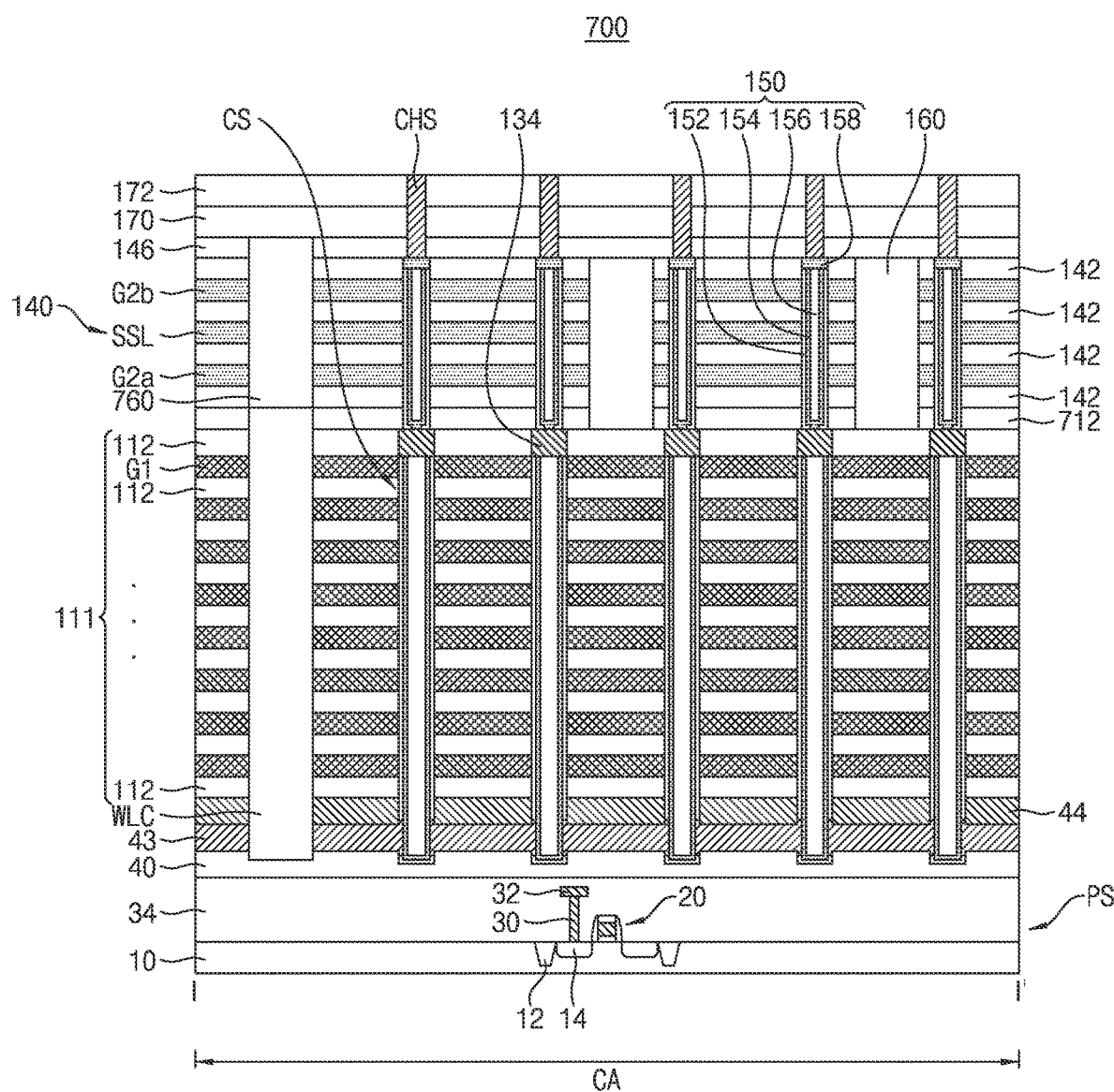
FIG. 28 is a cross-sectional view of the semiconductor device of FIG. 27 taken along lines I-I'.

FIG. 27 is a layout of a semiconductor device according to embodiments of the inventive concept, and FIG. 28 is a cross-sectional view of the semiconductor device of FIG. 27 taken along lines I-I'.

Referring to FIGS. 27 and 28, a semiconductor device 700 may include a first upper insulating layer 146, an isolation insulating layer WLC, and a stack isolation layer 760. The first upper insulating layer 146 may cover the top surface of the memory stack 111. The isolation insulating layer WLC may vertically penetrate the connection conductive layer 43, the supporter 44, the memory stack 111, and the first upper insulating layer 146. The top surface of the isolation insulating layer WLC may be disposed at a relatively higher level than the top surface of the channel structure CS, and may be disposed at a relatively lower level than the top surface of the channel contact 150. The stack isolation layer 760 may be disposed so as to be vertically aligned with the isolation insulating layer WLC. The stack isolation layer 760 may vertically penetrate the upper gate stack 140. For example, the stack isolation layer 760 may penetrate the first upper gate electrode G2a, the string selection line SSL, and the second upper gate electrode G2b.

FIGS. 29, 30, 31, 32 and 33 are related cross-sectional views illustrating in one example a method of manufacturing for the semiconductor device of FIG. 28.

Figure 7A:
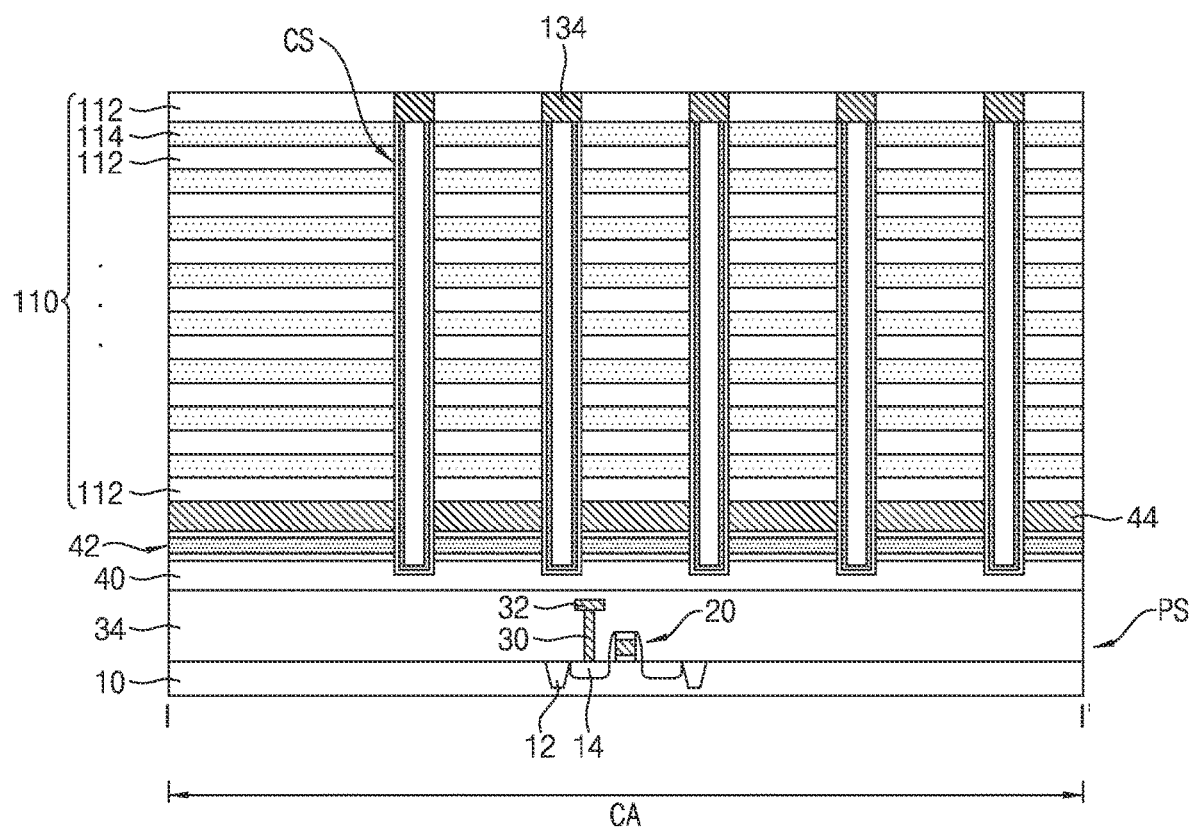
Figure 7B:
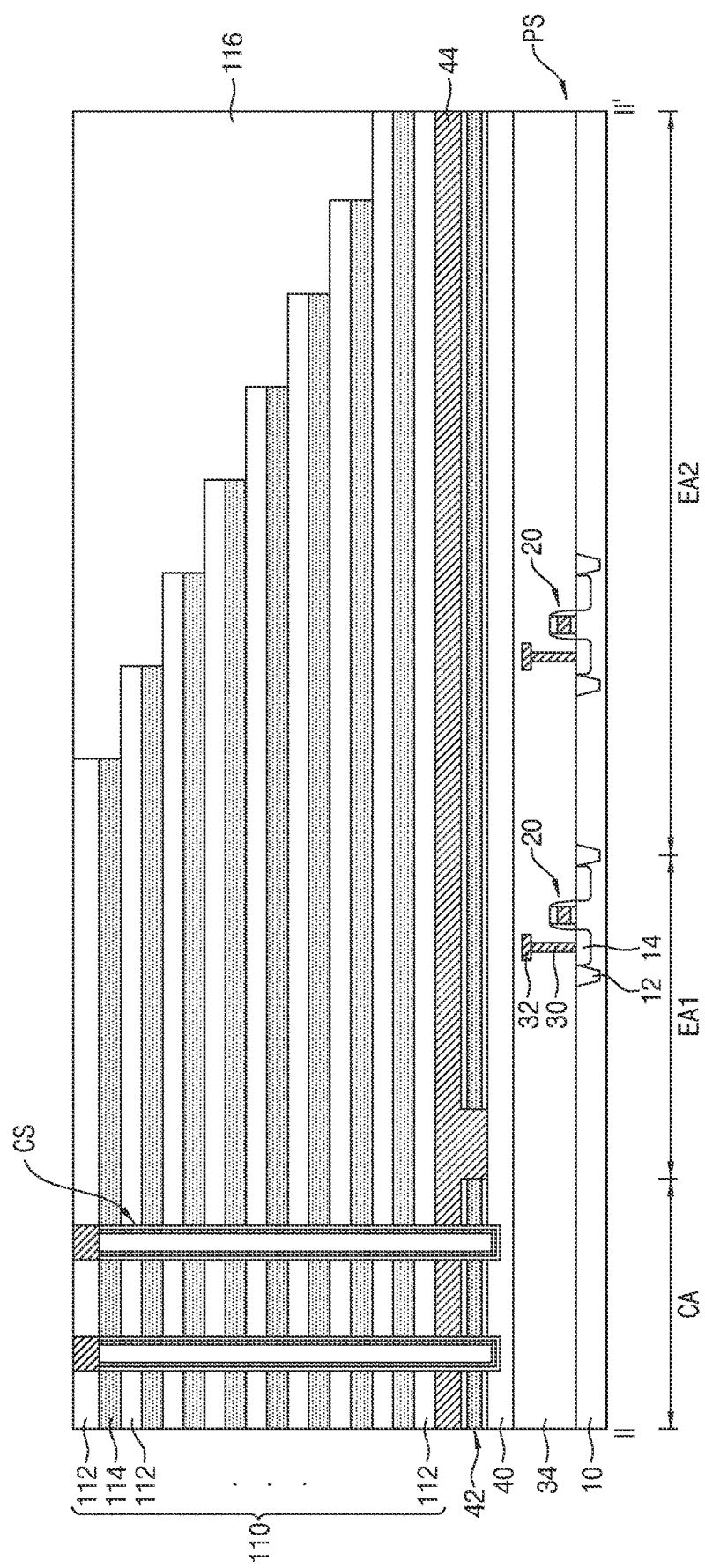
Figure 29:
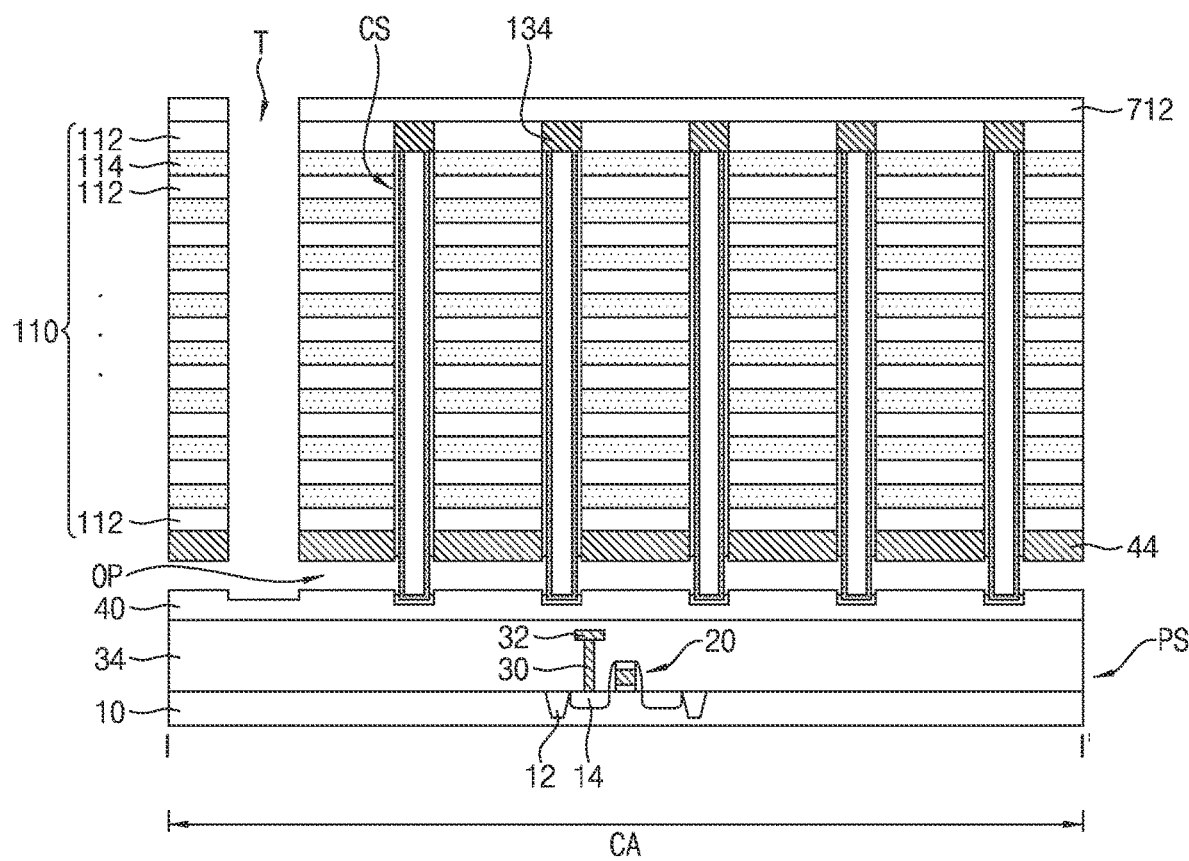
FIGS. 29, 30, 31, 32 and 33 are related cross-sectional views illustrating in one example a method of manufacturing for the semiconductor device of FIG. 28.

Referring to FIGS. 7A and 29, after the channel structure CS is formed, the first upper insulating layer 146 and the isolation trench T may be formed. The first upper insulating layer 146 may cover the top surface of the mold stack 110. The isolation trench T may vertically penetrate the mold stack 110 to expose the connection mold layer 42, and the portion of the connection mold layer 42 that is disposed in the cell array region CA may be removed. The connection mold layer 42 may be removed to form an opening OP between the lower conductive layer 40 and the supporter 44, and the channel structure may be partially exposed.

Figure 30:
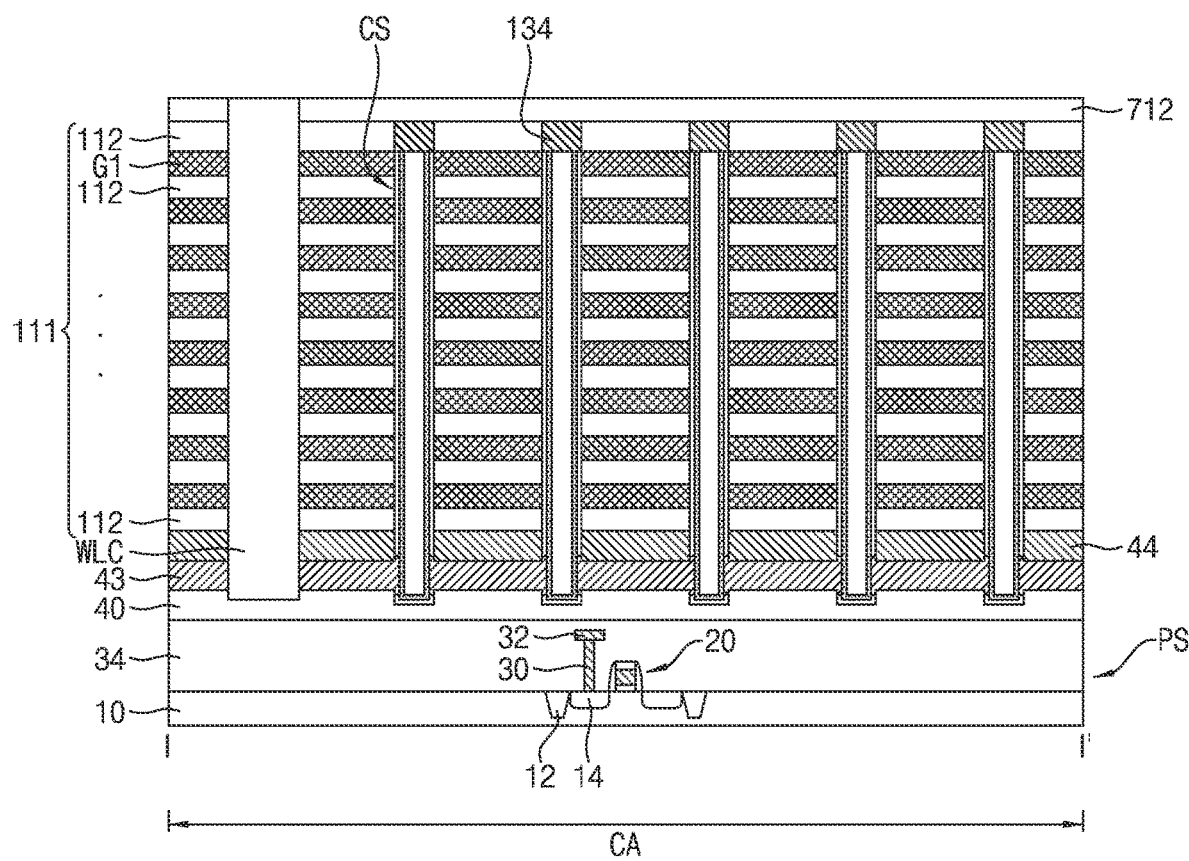

Referring to FIG. 30, a connection conductive layer 43, lower gate electrodes G1, and an isolation insulating layer WLC may be formed. The connection conductive layer 43 may fill the interior of the opening OP. The lower gate electrodes G1 and the lower mold layer 112 may be alternately disposed to constitute the memory stack 111. The isolation insulating layer WLC may be formed inside the isolation trench T, wherein the isolation insulating layer WLC may include a silicon oxide, silicon nitride, silicon oxynitride, or combinations thereof.

Figure 31:
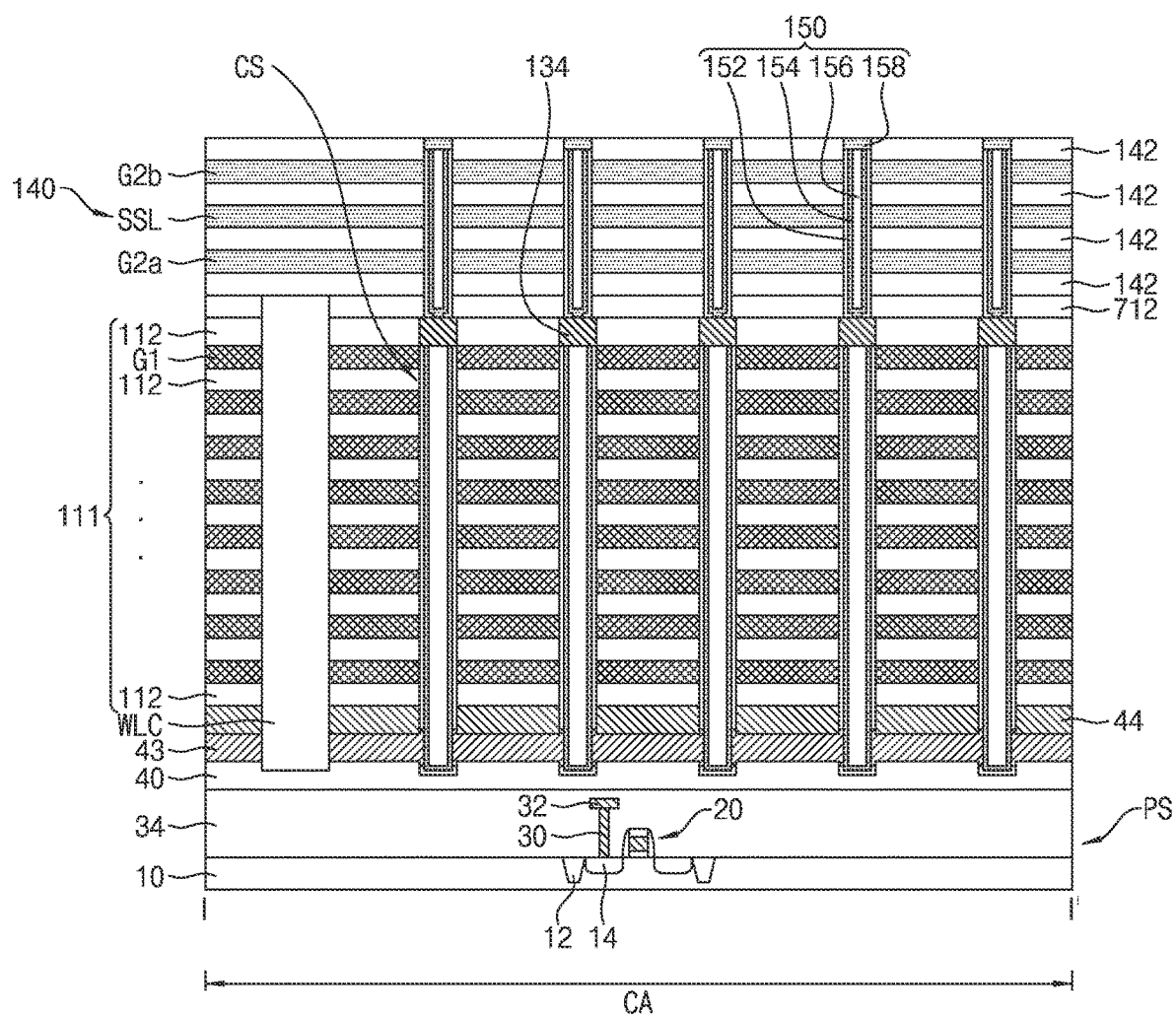

Referring to FIG. 31, an upper gate stack 140 and a channel contact 150 may be formed.

The upper gate stack 140 may include upper mold layers 142, a first upper gate electrode G2a, a string selection line SSL, and a second upper gate electrode G2b. The first upper gate electrode G2a, the string selection line SSL, and the second upper gate electrode G2b may be disposed between the upper mold layers 142.

The channel contacts 150 may vertically penetrate the upper gate stack 140. Each of the channel contacts 150 may be disposed so as to be vertically aligned with a corresponding one of the channel structures CS. The channel contacts 150 may contact with the conductive pads 134. The channel contact 150 may include a string insulating layer 152, a string channel layer 154, a string buried layer 156, and a string conductive pad 158.

Figure 32:
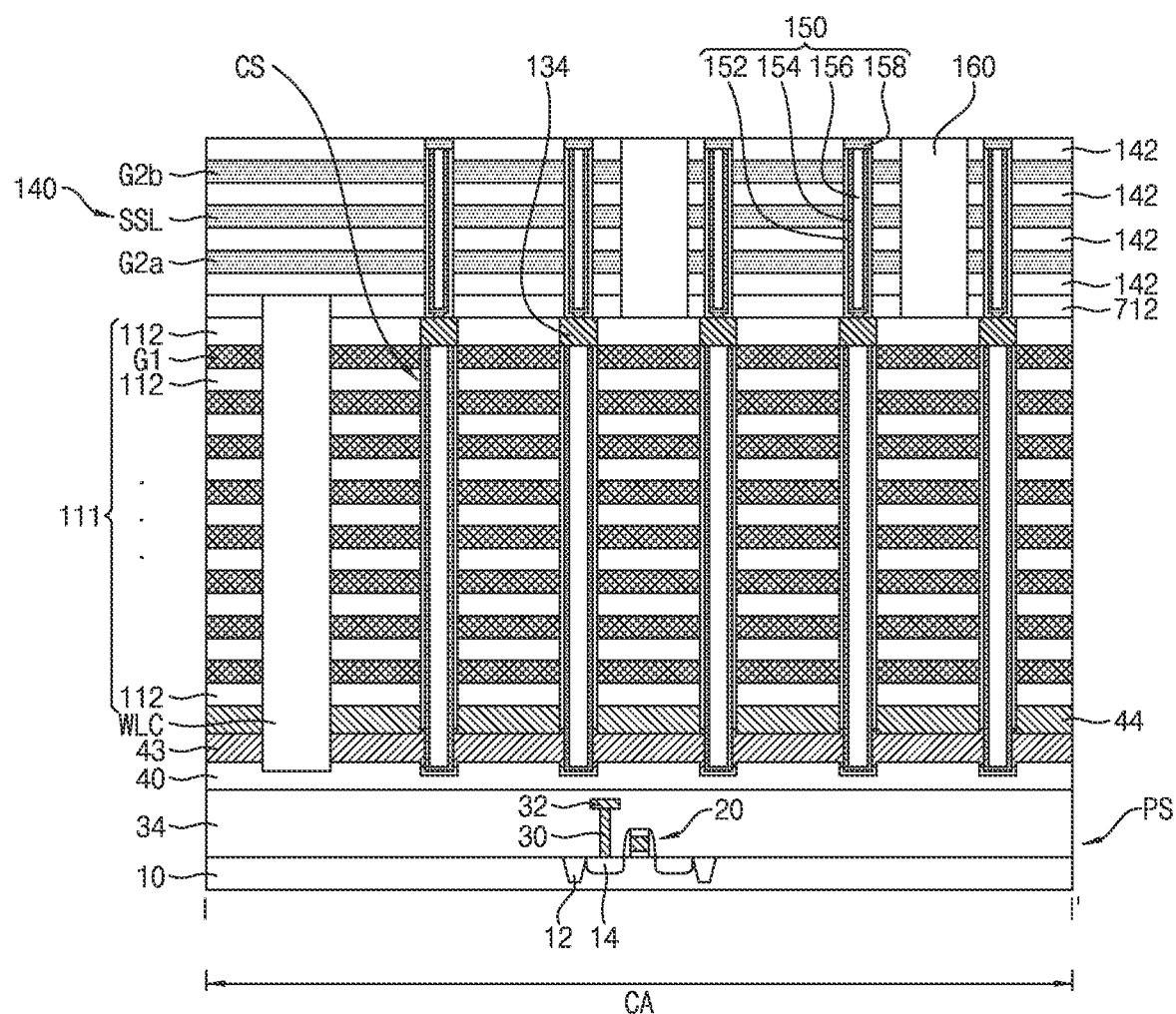

Referring to FIG. 32, a string selection line isolation layer 160 may be formed. The string selection line isolation layer 160 may vertically penetrate the upper gate stack 140 and the first upper insulating layer 146.

Figure 33:
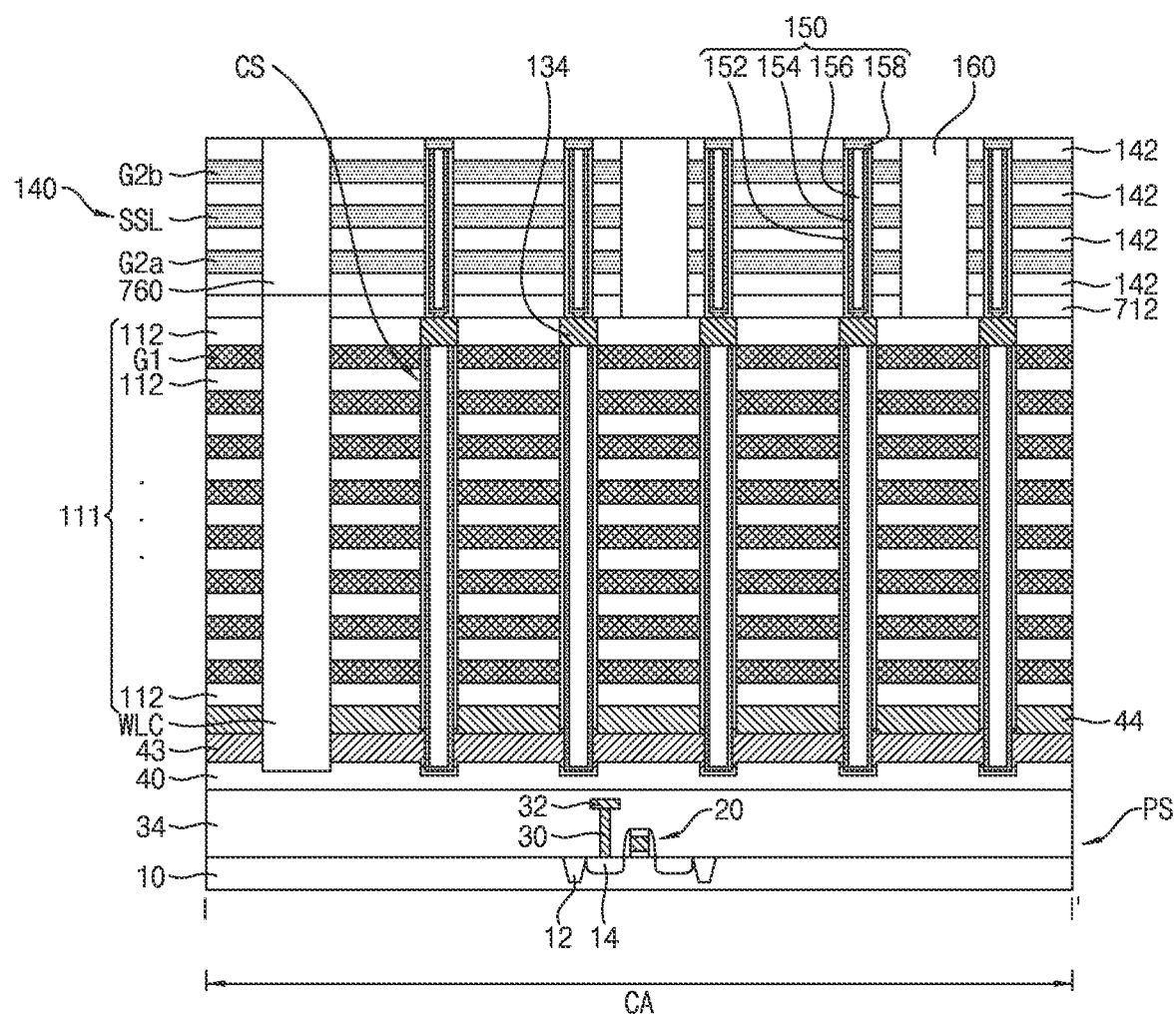

Referring to FIG. 33, a stack isolation layer 760 may be formed. The stack isolation layer 760 may be formed by anisotropically etching the upper gate stack 140 so that the same is vertically aligned with the isolation insulating layer and filling the etched portion with an insulating material. The stack isolation layer 760 may include a silicon oxide, silicon nitride, silicon oxynitride, or combinations thereof.

Referring back to FIG. 28, a second upper insulating layer 170, a third upper insulating layer 172, and channel studs CHS may be formed. The second upper insulating layer 170 may cover the upper gate stack 140, and the third upper insulating layer 172 may cover the second upper insulating layer 170. The channel studs CHS may vertically penetrate the second upper insulating layer 170 and the third upper insulating layer 172, and may be connected to the channel contacts 150.

As will be apparent to those skilled in the art upon consideration of the foregoing embodiments, a selection line stud may be formed through a separate process from a memory gate contact, thereby preventing or mitigating the effects of punching through a string selection line during the formation of the memory gate contact.

While the embodiments of the inventive concept have been described with reference to the accompanying drawings, it will be understood by those skilled in the art that various modifications may be made without departing from the scope of the inventive concept.

What is claimed is:

1. A semiconductor device comprising:
a stack on a substrate, the stack including gate electrodes spaced apart from each other in a vertical direction; and
a channel structure penetrating through the stack; and
gate contact plugs contacting the gate electrodes,
wherein the stack includes a lower stack and an upper stack on the lower stack,
wherein the channel structure includes:
a lower channel structure penetrating through the lower stack; and
an upper channel structure penetrating through the upper stack,
wherein the lower channel structure includes:
a lower insulating pattern; and
a lower channel layer on a side surface of the lower insulating pattern,
wherein the upper channel structure includes an upper channel layer electrically connected to the lower channel layer,
wherein the gate electrodes include:
a first gate electrode;
a second gate electrode on the first gate electrode; and
a third gate electrode on the second gate electrode,
wherein the gate contact plugs include:
a first gate contact plug contacting the first gate electrode and having a first width at a first height level;
a second gate contact plug contacting the second gate electrode and having a second maximum width at the first height level; and
a third gate contact plug contacting the third gate electrode and having a third width at the first height level,
wherein the first width is greater than the second width, and
wherein the second width is greater than the third width.

2. The semiconductor device of claim 1,
wherein the lower channel structure includes:
a lower pad on the lower insulating pattern and contacting the lower channel layer,
wherein the upper channel structure includes:
an upper insulating pattern, wherein the upper channel layer is on a side surface of the upper insulating pattern; and
an upper pad on the upper insulating pattern and contacting the upper channel layer, and
wherein the lower pad of the lower channel structure is configured to electrically connect the lower channel layer and the upper channel layer to each other.

3. The semiconductor device of claim 1,
wherein the upper stack includes at least one of the first, second and third gate electrodes,
wherein the lower stack includes a fourth gate electrode of the gate electrodes,
wherein the gate contact plugs further include a fourth gate contact plug contacting the fourth gate electrode.

4. The semiconductor device of claim 3, further comprising:
an upper stud on and contacting the fourth gate contact plug,
wherein an upper surface of at least one of the first, second, and third gate contact plugs is at a higher level than an upper surface of the fourth gate contact plug, and
wherein an upper surface of the upper stud is substantially at a same level as the upper surface of at least one of the first, second, and third gate contact plugs.

5. A semiconductor device comprising:
a stack including interlayer insulating layers and gate electrodes alternately stacked in a vertical direction;
a channel structure penetrating through the stack; and
gate contact plugs contacting the gate electrodes,
wherein the stack includes a lower stack and an upper stack on the lower stack,
wherein the gate electrodes include lower gate electrodes and an upper gate electrode on the lower gate electrodes,
wherein the channel structure includes:
a lower channel structure penetrating through the lower stack; and
an upper channel structure penetrating through the upper stack and contacting the lower channel structure, wherein the lower channel structure includes:
a lower insulating pattern; and
a lower channel layer on a side surface of the lower insulating pattern, wherein the upper channel structure includes an upper channel layer electrically connected to the lower channel layer,
wherein the gate contact plugs include:
a first lower gate contact plug contacting a first lower gate electrode of the lower gate electrodes; and
an upper gate contact plug contacting the upper gate electrode, and
wherein a width of the first lower gate contact plug at a first height level is greater than a width of the upper gate contact plug at the first height level.

6. The semiconductor device of claim 5,
wherein the gate contact plugs further include a second lower gate contact plug contacting a second lower gate electrode of the gate electrodes,
wherein the first lower gate electrode is at a higher level than the second lower gate electrode, and
wherein an upper surface of the upper gate contact plug is at a higher level than an upper surface of the second lower gate contact plug.

7. The semiconductor device of claim 6, further comprising:
a first stud on and contacting the second lower gate contact plug; and
a channel stud on and contacting the upper channel structure.

8. The semiconductor device of claim 7,
wherein an upper surface of the first stud is substantially at a same level as the upper surface of the upper gate contact plug.

9. The semiconductor device of claim 8,
wherein the upper surface of the first stud is substantially at a same level as an upper surface of the channel stud.

10. The semiconductor device of claim 6,
wherein the lower gate electrodes include a first material, and
wherein the upper gate electrode includes a second material different from the first material.

11. The semiconductor device of claim 5,
wherein the lower channel structure further includes a lower pad on the lower insulating pattern and contacting the lower channel layer, and
wherein the lower pad of the lower channel structure is configured to electrically connect the lower channel layer and the upper channel layer to each other.

12. The semiconductor device of claim 11,
wherein the upper channel structure further includes an upper insulating pattern and an upper pad on the upper insulating pattern, and
wherein the upper channel layer is on a side surface of the upper insulating pattern and contacts the upper pad.

13. The semiconductor device of claim 5,
wherein the channel structure further includes an information storage layer,
wherein the lower channel structure includes the information storage layer, and
wherein the upper channel structure does not include the information storage layer,
wherein the information storage layer is at a lower level than the upper stack, and
wherein the information storage layer is between the lower channel layer and the lower stack.

14. The semiconductor device of claim 5, further comprising:
a peripheral circuit structure vertically overlapping the stack; and
a structure including a common source and vertically overlapping the stack,
wherein the common source contacting the lower channel layer.

15. The semiconductor device of claim 5,
wherein a width of the lower channel structure is greater than a width of the upper channel structure.

16. A semiconductor device comprising:
a stack on a substrate, the stack including gate electrodes spaced apart from each other in a vertical direction;
a lower channel structure and an upper channel structure penetrating through the stack; and
gate contact plugs contacting the gate electrodes,
wherein the upper channel structure is on and in contact with the lower channel structure,
wherein the gate electrodes include a first gate electrode, a second gate electrode on the first gate electrode, and a third gate electrode on the second gate electrode,
wherein the gate contact plugs include:
a first gate contact plug contacting the first gate electrode,
a second gate contact plug contacting the second gate electrode, and
a third gate contact plug contacting the third gate electrode,
wherein an upper surface of the third gate contact plug is at a higher level than an upper surface of the first gate contact plug, and
wherein a width of the second gate contact plug at a first height level is greater than a width of the third gate contact plug at the first height level.

17. The semiconductor device of claim 16,
wherein the lower channel structure includes:
a lower insulating pattern;
a lower channel layer on a side surface of the lower insulating pattern; and
a lower pad on the lower insulating pattern and contacting the lower channel layer,
wherein the upper channel structure includes:
an upper insulating pattern;
an upper channel layer on a side surface of the upper insulating pattern;
an upper pad on the upper insulating pattern and contacting the upper channel layer, and
wherein the lower pad of the lower channel structure is configured to electrically connect the lower channel layer and the upper channel layer to each other.

18. The semiconductor device of claim 16, further comprising:
a first stud on and contacting the first gate contact plug; and
a channel stud on and contacting the upper channel structure.

19. The semiconductor device of claim 18,
wherein an upper surface of each of the first stud and the channel stud is substantially at a same level as the upper surface of the third gate contact plug.

20. The semiconductor device of claim 19,
wherein the upper surface of the first stud is substantially at a same level as an upper surface of the channel stud.

* * * * *